United States Patent
Sakai et al.

(10) Patent No.: US 7,563,147 B2
(45) Date of Patent: Jul. 21, 2009

(54) ORGANIC ELECTROLUMINESCENT DEVICE, METHOD OF MANUFACTURE THEREOF AND ELECTRONIC APPARATUS

(75) Inventors: Hirofumi Sakai, Suwa (JP); Kazunori Sakurai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 560 days.

(21) Appl. No.: 11/102,676

(22) Filed: Apr. 11, 2005

(65) Prior Publication Data
US 2005/0236983 A1 Oct. 27, 2005

(30) Foreign Application Priority Data
Apr. 21, 2004 (JP) ............... 2004-125402

(51) Int. Cl.
*H01L 51/40* (2006.01)
*H05B 33/10* (2006.01)

(52) U.S. Cl. .............. 445/24; 445/49; 445/46; 313/504; 313/506; 427/66

(58) Field of Classification Search ......... 313/504, 313/506; 445/24, 49, 46; 427/66
See application file for complete search history.

(56) References Cited

U.S. PATENT DOCUMENTS

| | | | | |
|---|---|---|---|---|
| 6,388,377 | B1* | 5/2002 | Kobayashi et al. | 313/505 |
| 6,960,877 | B1 | 11/2005 | Heeks et al. | |
| 2004/0169468 | A1* | 9/2004 | Peng | 313/512 |
| 2004/0239721 | A1* | 12/2004 | Usuda | 347/40 |
| 2005/0019585 | A1 | 1/2005 | Kashiwagi et al. | |
| 2005/0057148 | A1* | 3/2005 | Seki et al. | 313/504 |
| 2005/0067949 | A1* | 3/2005 | Natarajan et al. | 313/504 |

FOREIGN PATENT DOCUMENTS

| | | |
|---|---|---|
| CN | 1237318 | 12/1999 |
| CN | 1333927 | 1/2002 |
| JP | A 10-125929 | 5/1998 |
| JP | A 10-125930 | 5/1998 |
| JP | A 10-125931 | 5/1998 |
| JP | A 11-087063 | 3/1999 |
| JP | A 2000-100557 | 4/2000 |
| JP | A-2001-006879 | 1/2001 |
| JP | A 2003-36037 | 2/2003 |
| JP | A-2003-059663 | 2/2003 |
| JP | A-2003-208975 | 7/2003 |
| JP | A-2003-234180 | 8/2003 |
| JP | A 2004-142422 | 5/2004 |
| JP | A 2004-303698 | 10/2004 |
| JP | A 2004-303699 | 10/2004 |
| JP | A 2004-303700 | 10/2004 |
| JP | A 2004-362819 | 12/2004 |
| KR | 2003-0011566 | 2/2003 |
| KR | 2004-0018921 | 3/2004 |

* cited by examiner

*Primary Examiner*—Karabi Guharay
(74) *Attorney, Agent, or Firm*—Oliff & Berridge, PLC

(57) ABSTRACT

A method for manufacturing an organic electroluminescent device having an organic functional layer formed between facing electrodes, the method includes forming separators which separate either of the electrodes into a strip, forming an electrode film between the separators with a vapor deposition method, and placing a further electrode material on the electrode film which is formed between the separators with the vapor deposition method.

6 Claims, 17 Drawing Sheets

ORGANIC ELECTROLUMINESCENT DEVICE, METHOD OF MANUFACTURE THEREOF AND ELECTRONIC APPARATUS

BACKGROUND OF THE INVENTION

1. Field of the Invention

The present invention relates to an organic electroluminescent device, a method of manufacture thereof and an electronic apparatus.

Priority is claimed on Japanese Patent Application No. 2004-125402, filed Apr. 21, 2004, the content of which is incorporated herein by reference.

2. Description of Related Art

In recent years, in electronic apparatuss such as notebook computers, mobile phones and electronic notes, a display device provided with an organic electroluminescent (hereafter called organic EL) element in correspondence with a picture element, such as an organic EL device, has been proposed as device for displaying information.

One of such organic EL devices is a passive matrix type (a simple matrix type) organic EL device. Generally, the passive matrix type organic EL device includes a plurality of first electrodes formed into a strip extending in a predetermined direction on a substrate, a plurality of second electrodes into the stripe directed in the direction perpendicular to the first electrodes, and an organic functional layer which is sandwiched between the first electrode and the second electrode from the top and the bottom in a crossing area. The organic functional layer includes a light-emitting layer which emits light when an electric current passes through the first electrode and the second electrode, and the passive matrix type organic EL device includes a plurality of the organic functional layers including the light-emitting layer in correspondence with one pixel.

The second electrode of a passive matrix type organic EL device is generally formed with a vacuum evaporation method. In the vacuum evaporation method, as is shown, for example, in Japanese Unexamined Patent Application, First Publication No. H11-87063, the second electrodes are separated by providing a separator of a predetermined thickness between areas to have the second electrodes formed thereon, and vapor depositing the second electrode material from a direction perpendicular or oblique to a substrate.

A display device having a striped electrode structure tends to cause a voltage drop in an extending direction of an electrode, which further causes the unevenness of a picture quality. In particular, a display device of increased has an increased amount of an electric current passing through one electrode, so that the above tendency becomes strong.

The present invention is designed with respect to the above-described problems, and is directed at providing a method for manufacturing an organic EL device which has a reduced voltage drop in an electrode and is preferably applicable to a substrate to be increased in size.

SUMMARY OF THE INVENTION

A method for manufacturing an organic EL device having an organic functional layer formed between facing electrodes according to the present invention, for the purpose of achieving the above-described objects, the method includes forming separators which separate either of the electrodes into a strip, forming an electrode film between the separators with a vapor deposition method, and placing a further electrode material on the electrode film which is formed between the separators with the vapor deposition method.

The vapor deposition method includes a vacuum vapor deposition method, a sputtering method and a CVD method (a chemical vapor deposition method).

The above-described electrode material is, for instance, a metal-dispersed ink.

The method for manufacturing an organic EL device includes placing an electrode material further on the electrode film which has been formed between separators with a vapor deposition method, to increase the thickness of the electrode.

An electrode material made of a metal-dispersed ink can place a large amount of the material at a time.

By increasing the thickness of an electrode with the above-described method, an organic EL device manufactured with the manufacturing method has a reduced voltage drop in the electrode and acquires a uniform picture quality. Accordingly, the manufacturing method is preferably applied to a substrate to be increased in size.

The manufacturing method of placing an electrode material on an electrode film which is formed with a vapor deposition method also avoids causing a damage to an organic functional layer caused by a liquid contained in the electrode material, due to the coated electrode film.

In the above-described manufacturing method, it is recommended to place an electrode material so as not to contact with both of two adjacent separators among a separators.

Though a vapor deposition method can form an electrode film on a separator, by placing an electrode material for increasing the film thickness so as not to contact with both of two adjacent separators, a short circuit between electrodes through a separator is prevented.

In addition, in the above-described method, the above-described electrode material may be placed so as to contact with one of two adjacent separators among the separators and so as not to contact with the other.

Though a vapor deposition method can form an electrode film on a separator as well, by placing an electrode material for increasing the film thickness so as to contact it with one of two adjacent separators between the separators and so as not to contact it with the other, a short circuit between the electrodes through the separator is prevented.

The above-described method is allowed to place the material with a lower accuracy than that in the method of placing the material so as not to contact it with both separators, and is preferably used for a device having a narrow space between the two adjacent separators.

In the above-described manufacturing method, it is recommended to place the above-described electrode material with a droplet ejecting method.

The droplet ejecting method can place a large amount of materials at a time, and easily control both the amount and the position of the material to be placed. In addition, the electrode film formed with the above-described vapor deposition method is preferably made of a metallic material having low surface energy.

Thereby, the accuracy in placing the electrode material is improved.

Next, an organic EL device having an organic functional layer formed between facing electrodes according to the present invention has one electrode which is separated into a strip by the separators and has a layered structure composed of the films.

In an organic EL device, the electrode formed into a strip has a layered structure composed of the films to increase the thickness of the electrode. For this reason, the organic EL device has a reduced voltage drop in an electrode and acquires a uniform picture quality, and is preferably applied to a substrate to be increased in size.

Here, the above-described films are recommended to include the first film formed with a vapor deposition method and the second film formed into a strip on the above-described first film in between the separators.

The above-described second film is formed preferably with the use of a droplet ejecting method.

By employing the configuration composed of the first film formed with the vapor deposition method and the second film formed thereon into a strip, the striped electrode can acquire a reliably increased thickness.

Furthermore, by forming an electrode with a droplet ejecting method, the accuracy in placing an electrode material is enhanced, and the film thickness of the electrode is inexpensively and easily increased.

In the above-described organic EL device, the above-described second film is formed so as not to contact with both of two adjacent separators among the separators, so that the short circuit between electrodes through the separator is reliably prevented.

In addition, the above-described second film is formed so as to contact with one of the two adjacent separators among the separators and so as not to contact with the other, so that the short circuit between electrodes through the separator is reliably prevented.

Next, an electronic apparatus according to the present invention has an organic EL device as displaying device. The electronic apparatus according to the present invention can be exemplified by, for instance, information processors such as a notebook computer, a mobile phone and an electronic note, a clock and a word processor. By adopting the organic EL device according to the present invention for the display of such electronic apparatuses, the electronic apparatuses can be provided with a display having a reduced voltage drop in an electrode and a uniform picture quality.

DETAILED DESCRIPTION OF THE INVENTION

Figure 1:
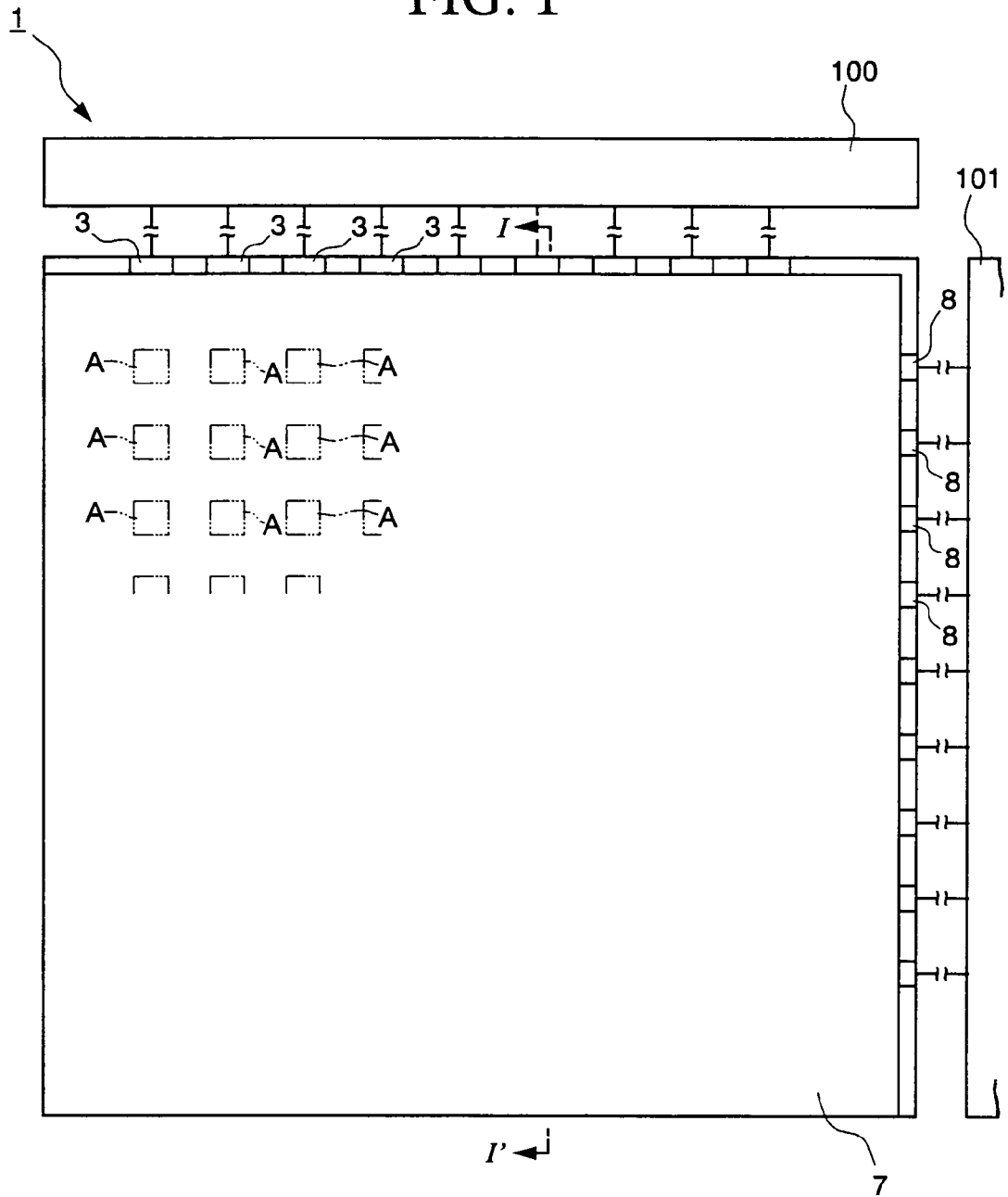
FIG. 1 is a plan view of an organic EL device according to the present invention.

In the following, referring to the drawings, one embodiment of an organic EL device, a manufacturing method therefor and an electronic apparatus according to the present invention will be described. In each drawing referred to below, there may be cases where each layer and each member are drawn with a different scale in order to make the dimension recognizable on a drawing.

First Embodiment

Figure 2:
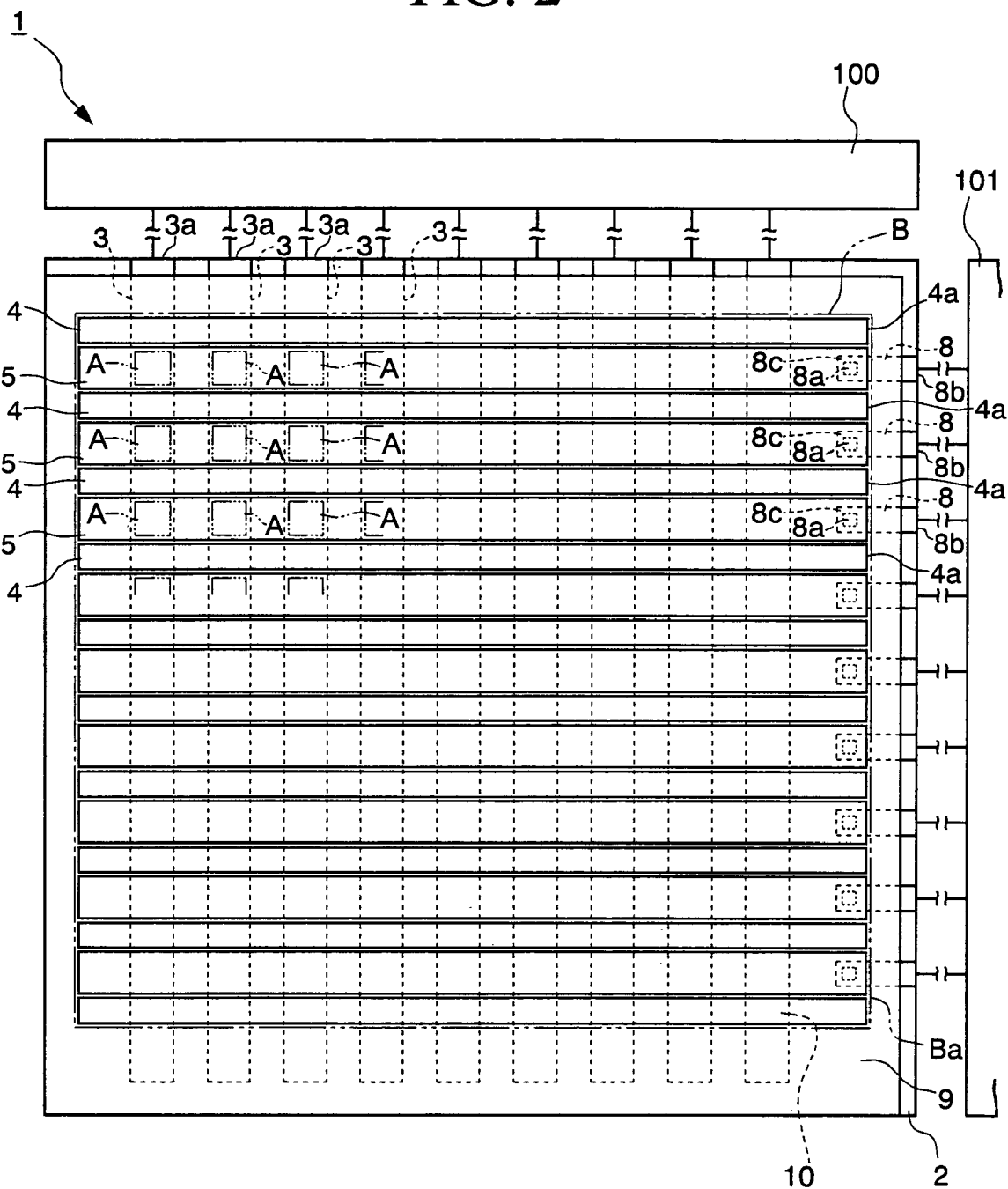
FIG. 2 is a view of an internal configuration of an organic EL device according to the present invention.
Figure 3:
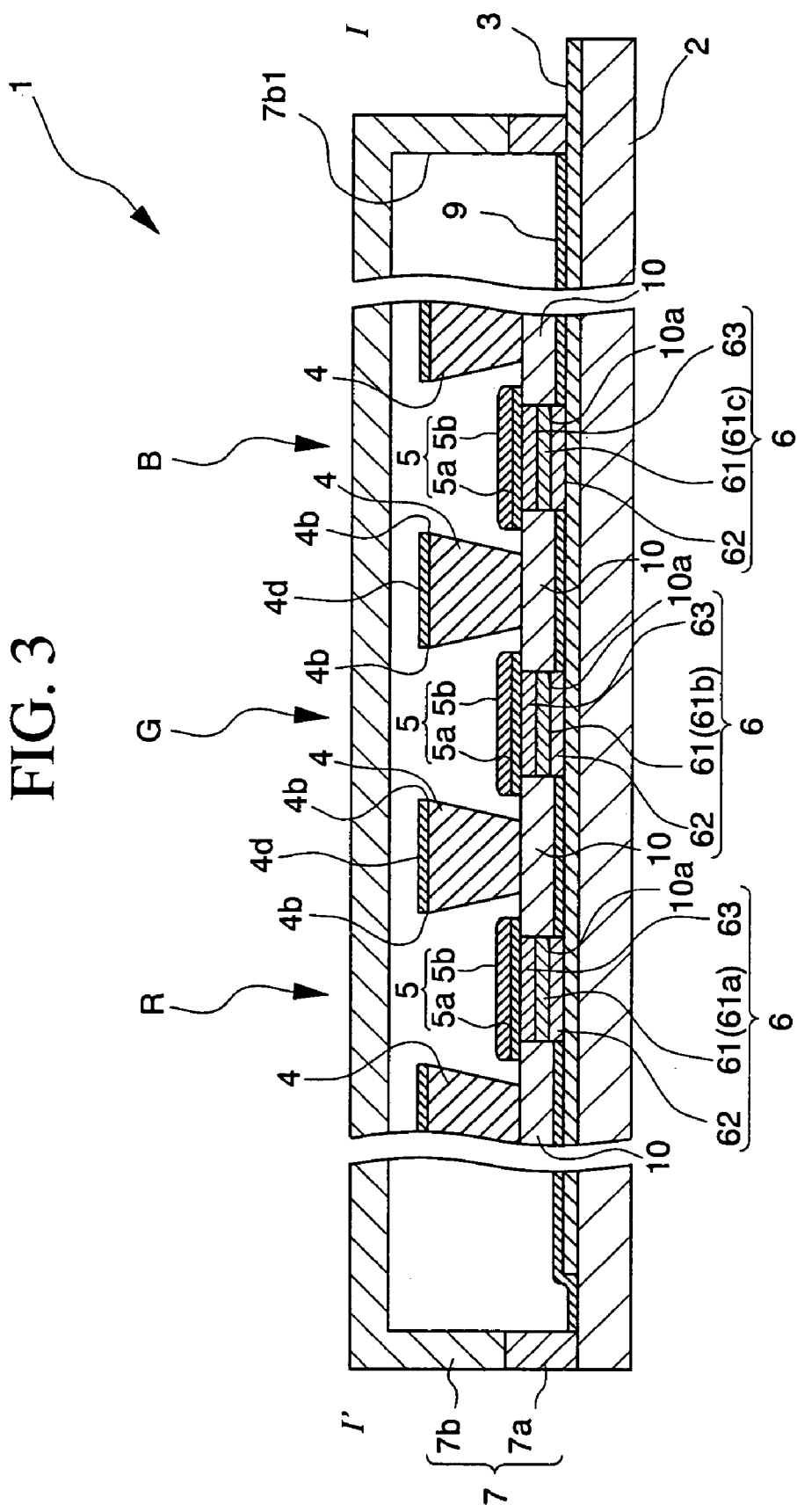
FIG. 3 is a view on an arrow I-I' in FIG. 1.

FIGS. 1 to 3 are schematic block diagrams which schematically show a passive matrix type organic EL (electroluminescent) display device according to the present embodiment. FIG. 1 is a plan view, FIG. 2 is an inner block diagram of an organic EL device 1, and FIG. 3 is a view on an arrow of I-I' in FIG. 1. As shown in these drawings, the present organic EL device 1 mainly includes: a plurality of first electrodes (anodes) 3 with a strip extending to a predetermined direction on a substrate 2; a plurality of cathode separators (separators) 4 extending to the direction perpendicular to the extending direction of the first electrodes; a bank layer 10 arranged below the cathode separators 4; second electrodes (cathodes) 5 formed between the cathode separators 4; an organic functional layer 6 sandwiched between the first electrode 3 and the second electrode 5 from the top and the bottom, in a crossing area A (a light-emitting area) of the first electrode 3 and the second electrode 5; and a sealing section 7 for sealing the first electrodes 3, the cathode separators 4, the second electrodes 5 and the organic functional layers 6 with a can.

In FIG. 2, reference character B denotes a cathode-separator-forming area which is a range where the cathode separator 4 is formed on the substrate 2. In the vicinity of one end Ba of the cathode-separator-forming area B, as shown in the drawings, a plurality of junctions 8a are formed in a position deviated to the center of the substrate from both ends of the cathode separators 4, while being sandwiched between the cathode separators 4. The junctions 8a are a part of a connecting terminal 8, and are directly connected to the second electrodes 5. In addition, the cathode-separator-forming area B is the area in which a plurality of the cathode separators 4 are formed on the substrate 2, but more specifically, is the whole area where the cathode separators 4 and areas between the cathode separators 4 exist.

In addition, the first electrode 3 and a connecting terminal 8 extend so that the end 3a of the first electrode 3 and the end 8b of the connecting terminal 8 can be placed in a position outside a sealing section 7; to the end 3a of the first electrode 3, a data-side drive circuit 100 has a shift register, a level shifter, a video line and an analog switch is connected; and to the end 8b of the connecting terminal 8, a scanning-side drive circuit 101 has a shift register and a level shifter is connected.

As shown in FIG. 3, an organic functional layer 6 is arranged in the state of being sandwiched between the first electrode 3 and the second electrode 5, which are placed so as to face each other, and includes a light-emitting layer 61 which emits a light having a predetermined wavelength when a current passes between the first electrode 3 and the second electrode 5. An organic EL device 1 has a plurality of light-emitting areas A in which the organic functional layer containing such a light-emitting layer 61 is formed, in a matrix form, and thereby has a function of a display device. In the organic EL device 1 according to the present embodiment, a substrate 2 and the first electrode 3 have translucency, and are configured so that the light emitted from the light-emitting layer 61 can be projected from the substrate 2 side. In addition, as shown in the drawing, the organic functional layer 6 is accommodated in the space surrounded by a bank layer 10, the first electrode 3 and the second electrode 5. As a result, the organic functional layer 6 is prevented from being deteriorated by moisture or air, which enters from outside.

The material of a substrate 2 having translucency includes, for instance, glass, quartz and a resin (plastic and a plastic film), and particularly, an inexpensive soda glass substrate is preferably used. A plurality of the first electrodes 3 are formed of a translucent conductive material metallic consisting of a metal oxide such as indium tin oxide (ITO) and indium zinc oxide (IZO), are set to have a strip, and are placed at predetermined spacings. The first electrode 3 plays a role in injecting positive holes (hereafter called holes) into an organic functional layer 6. A connecting terminal 8 is formed of a metal having electroconductivity, is set to have a rectangle form, and as shown in the drawing, is arranged so that its own end 8c is placed between the cathode separators 4.

On a substrate 2 on which the first electrode 3 and a connecting terminal 8 are formed, an insulation film 9 made of a silicon oxide film ($SiO_2$) is formed. The insulation film 9 is patterned so that the first electrode 3 in a light-emitting area A, the vicinity of the end 3a of the first electrode 3, a junction 8a and the vicinity of the end 8b of the connecting terminal 8 can be exposed. The insulation film 9 is patterned so that the junction 8a can be placed in a position deviated to the center of the substrate 2 from an end 4a of a cathode separator 4 (one end Ba in a cathode-separator-forming area B).

A bank layer 10 is formed on an insulation film 9 in a cathode-separator-forming area B so as not to cover a junction 8a. The bank layer 10 is made of an organic material superior in heat resistance and solvent resistance, such as an acrylic resin and a polyimide resin, and has an opening 10a formed in a position corresponding to a light-emitting area A. The bank layer also has a thickness set to be thinner than that of a cathode separator 4 and thicker than that of an organic functional layer 6.

A plurality of cathode separators 4 formed on a bank layer 10 are formed of a photosensitive resin such as polyimide, and have the thickness of 6 μm for instance and the shape of a reverse taper in a cross section of a width direction, and each of the cathode separators 4 is arrayed at predetermined spacings. The cathode separator 4 is formed as shown in the drawing, so that an end 4b in the width direction at the top of the cathode separator 4 can be placed outside the edge of an opening 10a formed by the bank layer 10. In addition, the cathode separator 4 is made of a material different from the bank layer 10, so that the bank layer 10 cannot be etched, for instance, when the cathode separators 4 are formed with a photolithography technology.

An organic functional layer 6 is a layered body consisting of a hole injection/transportation layer 62, a light-emitting layer 61 and an electron injection/transportation layer 63, and is accommodated in the opening 10a of the bank layer 10. The hole injection/transportation layer 62 is formed of a mixture of a polythiophene derivative such as polyethylen dioxy thiophen, and polystyrene sulfonate. The hole-injection/transportation layer 62 has the functions of injecting holes into a light-emitting layer 61 and transporting the holes in the inner part of the hole-injection/transportation layer 62.

A light-emitting layer 61 has three types of a red-light-emitting layer 61a for emitting a red light (R), a green-light-emitting layer 61b for emitting a green light (G), and a blue-light-emitting layer 61c for emitting a blue light (B), and each of the light-emitting layers 61a to 61c is arranged into a mosaic pattern. The usable material of the light-emitting layer 61 includes, for example, anthracene, pyrene, 8-hydroxyquinoline aluminum, a bisstyrylanthracene derivative, a tetraphenyl butadiene derivative, a coumarin derivative, an oxadiazole derivative, a distyrylbenzene derivative, a pyrrolopyridine derivative, a perynone derivative, a cyclopentadiene derivative, a thiadiazolopyridine derivative; or the low molecular materials doped with rubrene, a quinacridon derivative, a phenoxazone derivative, DCM, DCJ, perynone, a perylene derivative, a coumarin derivative, and/or a diazaindacene derivative.

An electron injection/transportation layer 63 has the functions of injecting electrons into a light-emitting layer 61 and transporting the electrons in the inner part of the electron-injection/transportation layer 63. For the material of the electron injection/transportation layer 63, for instance, lithium quinolinol, lithium fluoride or bathophen cesium can be preferably used. A metal having a work function of 4 eV or less, such as Mg, Ca, Ba, Sr, Li, Na, Rb, Cs, Yb and Sm, can be also used.

A second electrode 5 has a layered structure consisting of a plurality of films. Specifically, the second electrode 5 has the first film 5a formed with a vapor deposition method, and the second film 5b of an auxiliary electrode to be formed on the first film 5a, in order to increase the thickness of the second electrode. Here, the first film 5a may be any of a transmission layer, a reflection layer and a layer including the transmission layer and the reflection layer; and the second film 5b is the reflection layer if the first film 5a is the transmission layer, or is any layer otherwise. In addition, the second film 5b is formed with a droplet ejecting method as will be described below.

A material for forming the first film 5a includes, for instance, Al, Mg, Au, Ag and Ca, and besides ITO, IZO and lithium fluoride LiF. A layered structure containing the transmission layer and the reflecting layer in the first film 5a includes, for instance, a layered film of Ca and Al (Ca/Al; transmission layer/reflection layer), Mg/Ag, Ca/Ag, Ba/Ag and M/Ag, (where M is at least one of rare earth elements, and is preferably at least one element among Ce, Yb, Sm, Er, Y, La, Gd (gadolinium), Dy (dysprosium) and Nd (neodymium)). In addition, a film consisting of LiF (for instance, LiF/Ca/Al) may be arranged on a light-emitting layer side. When a cathode has a layered structure, the layer nearer to the light-emitting layer is preferably formed of a material having a lower work function.

The first film 5a is preferably formed with a vacuum vapor deposition method in the respect of preventing the light-emitting layer from being damaged by heat, but may be formed with another method such as a sputtering method and a CVD method. In the present embodiment, the first film 5a is formed so as to cover the opening 10a of a bank layer 10.

On the other hand, the second film 5b is formed on the above-described first film 5a between a plurality of cathode separators 4, and is also formed so as not to contact with both of the two adjacent cathode separators 4. When the first film 5a is formed with a vapor deposition method, an evaporated film having the same quality as the first film 5a is formed on the top surface 4d of the cathode separator 4, but by forming the second film 5b so as not to contact with both of the two adjacent cathode separators 4, a short circuit between the second electrodes 5 through the cathode separator 4 is reliably prevented. The material for forming the second film 5b will be described in detail below. In addition, on the second film 5b, a protective layer formed of SiO, $SiO_2$ or SiN for preventing oxidation may be provided as needed.

A sealing portion 7 is composed of a sealing resin 7a coated on the substrate 2 and a sealing can (a sealing member) 7b. The sealing resin 7a is an adhesive for bonding the sealing can 7b to the substrate 2, and is circumferentially coated around the substrate 2 with a micro-dispenser for instance. The sealing resin 7a is made of a thermosetting resin or an ultraviolet-curing resin, and is particularly, preferably an epoxy resin which is one of the thermosetting resins. In addition, the sealing resin 7a employs a material of hardly allowing oxygen and moisture to pass therethrough, and prevents flowing water or oxygen from invading inside the sealing can 7b from the clearance between the substrate 2 and the sealing can 7b to inhibit the oxidation of the second electrode 5 or a light-emitting layer 61.

The sealing can 7b has a recess 7b1 for accommodating the first electrode 3, an organic functional layer 6 and the second electrode 5 formed in the inside, and is bonded to a substrate 2 through a sealing resin 7a. In addition, in the inner side of the sealing can 7b, a getter material for absorbing or removing oxygen and moisture can be provided outside a cathode-separator-forming area B, as needed. The preferably usable getter material includes, for instance, an alkali metal such as Li, Na, Rb and Cs, an alkali earth metal such as Be, Mg, Ca, Sr and Ba, an oxide of the alkali earth metal and the hydroxide of the alkali metal or the alkali earth metal. The oxide of the alkali earth metal reacts with water to be changed into a hydroxide, and thereby acts as a dehydrating material. The alkali metal and the alkali earth metal react with oxygen to be changed to an oxide, and also react with water to be changed to a hydroxide, so that they act not only as a deoxidizing material but also as a dehydrating material. Thereby, the getter material prevents oxidation of an organic functional layer 6 and can enhance the reliability of a device.

In the following, a method for manufacturing an organic EL device 1 according to the present embodiment will be described referring to drawings. A method for manufacturing an organic EL device 1 according to the present embodiment includes, for instance, (1) a first-electrode-forming step (2) an insulation-film-forming step, (3) a bank-layer-forming step, (4) a cathode-separator-forming step, (5) a plasma treatment step, (6) a hole injection/transportation layer-forming step, (7) a light-emitting layer-forming step, (8) an electron injection/transportation layer-forming step, (9) a second-electrode-forming step and (10) a sealing step. The manufacturing method is not limited to them, but other steps may be removed or added as needed.

(1) First-Electrode-Forming Step

Figure 4A:
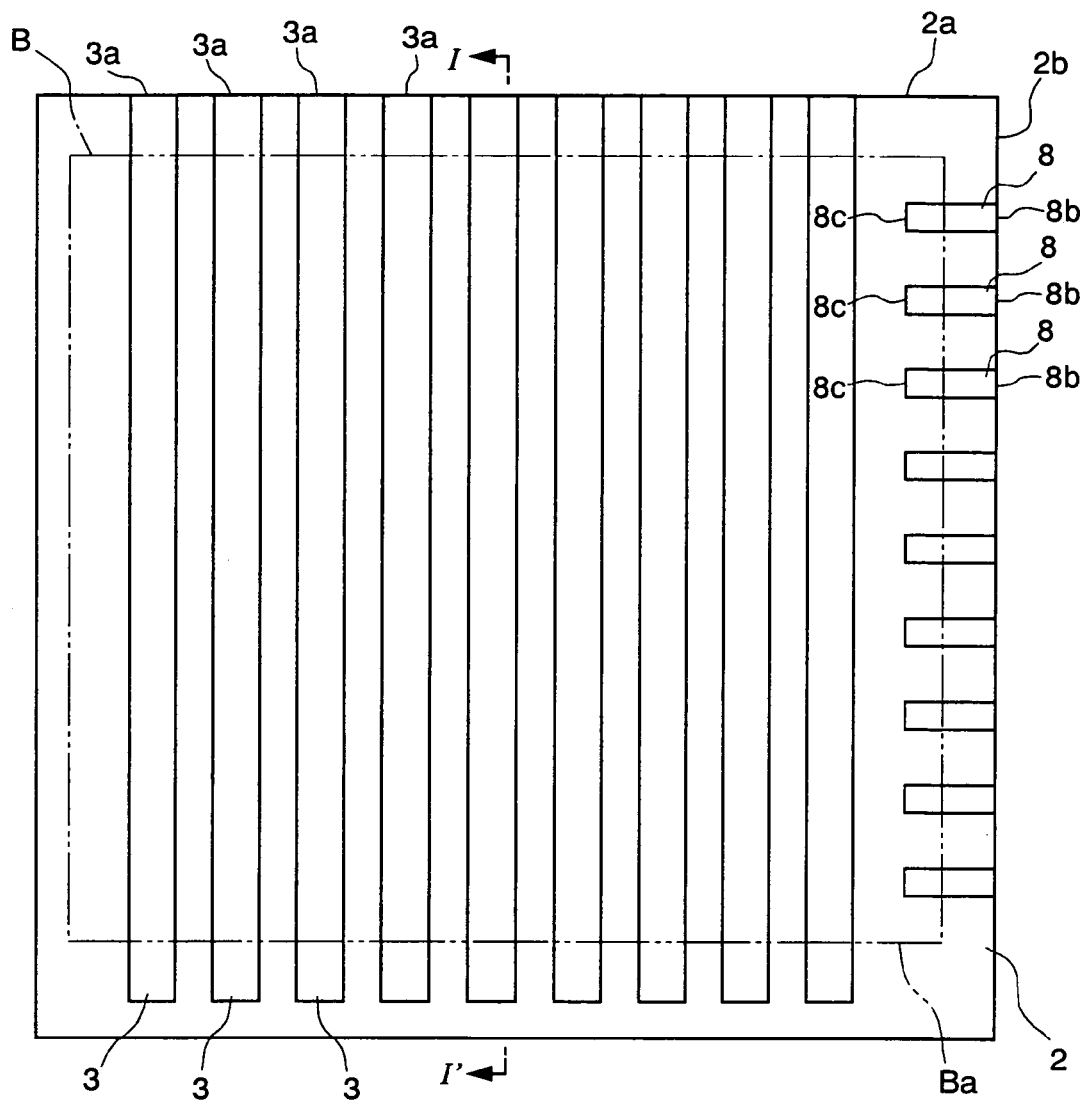
FIGS. 4A and 4B are explanatory drawings for describing a method for manufacturing an organic EL device.
Figure 4B:
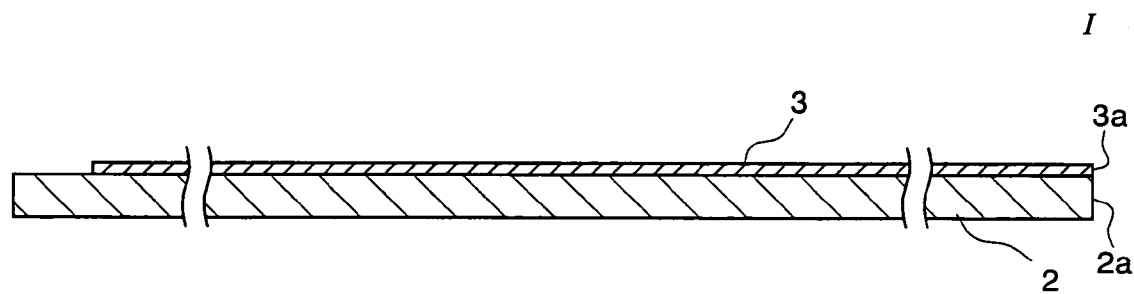

A first-electrode-forming step is a step for forming a plurality of the first electrodes 3 formed into a strip form (a strip) on a substrate 2, so as to extend to a predetermined direction. The first-electrode-forming step is a step, as shown in FIGS. 4A and 4B, of forming a plurality of the first electrodes 3 made of a metallic oxide such as ITO and IZO on a substrate 2, with a sputtering method. Thereby, a plurality of the first electrodes 3 having the strip shape are formed at predetermined spacings so that one end 3a (an upper side in FIG. 4A) can reach the end 2a of the substrate 2. In the first-electrode-forming step, a connecting terminal 8 is also formed. The connecting terminal 8 is formed as shown in the drawings, so that the one end 8b can reach the end 2b of the substrate 2 and the other end 8c is placed in the position deviated to the center of the substrate 2 from the end Ba of the bank forming area B.

(2) Insulation-Film-Forming Step

Figure 5A:
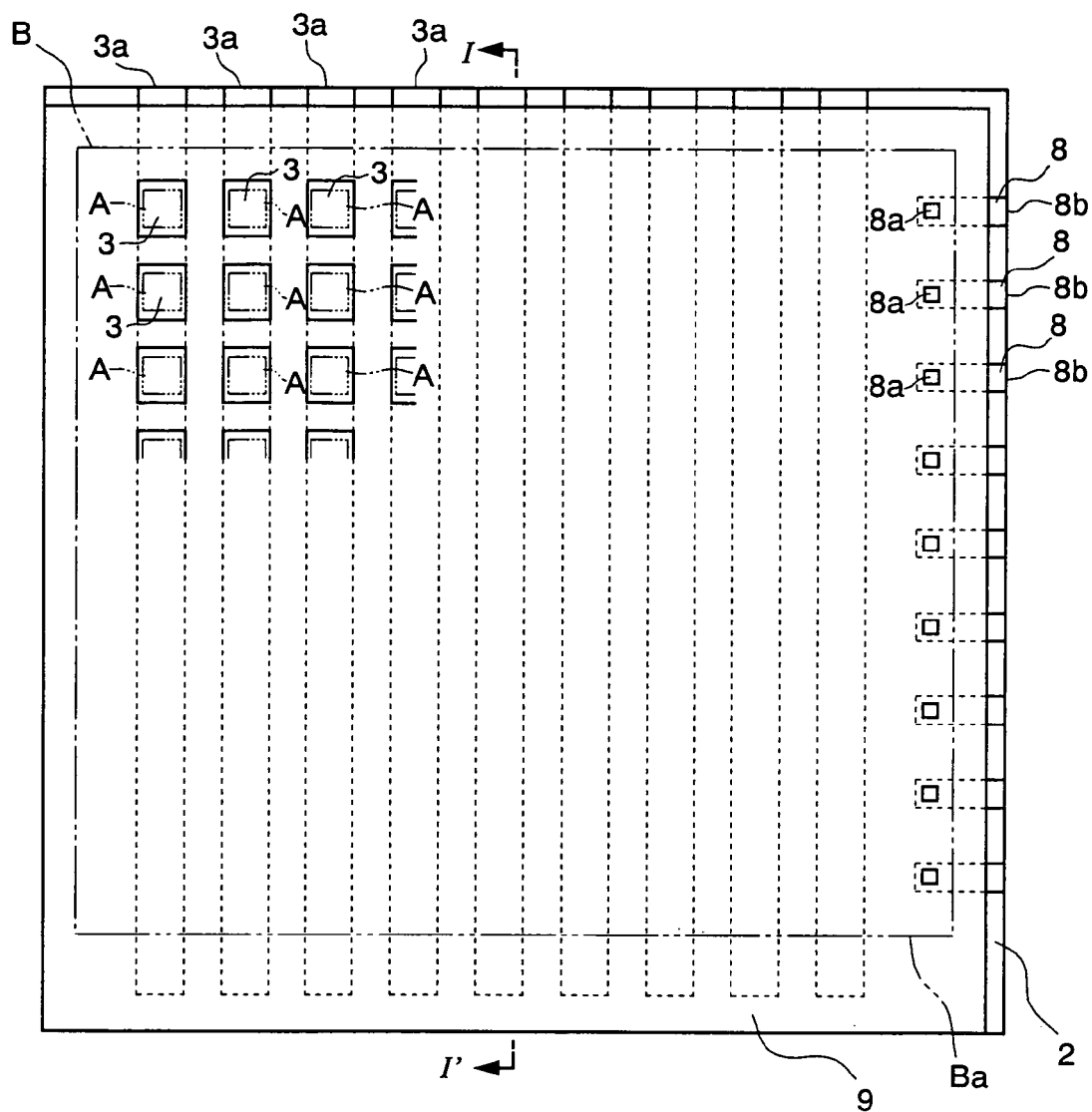
FIGS. 5A and 5B are explanatory drawings for describing a method for manufacturing an organic EL device.
Figure 5B:
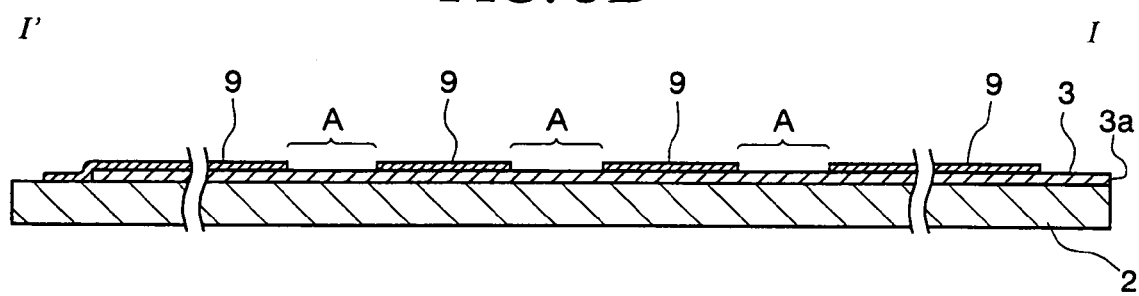

An insulation-film-forming step is a step for forming an insulation film 9 on a substrate 2, the first electrode 3 and the connecting terminal 8, while patterning it as shown in FIGS. 5A and 5B so as to expose the first electrode 3 of a light-emitting area A, the vicinity of the end 3b of the first electrode 3, the vicinity of a junction 8a and the end 8b of a connecting terminal 8. The insulation-film-forming step forms the insulation film 9 by a plasma CVD method using tetraethoxysilane and oxygen gas or the like as raw materials. The insulation film 9 is patterned so that the junction 8a is placed in a position deviated from the end Ba of the cathode-separator-forming area B toward the center of the substrate 2.

(3) Bank-Layer-Forming Step

Figure 6A:
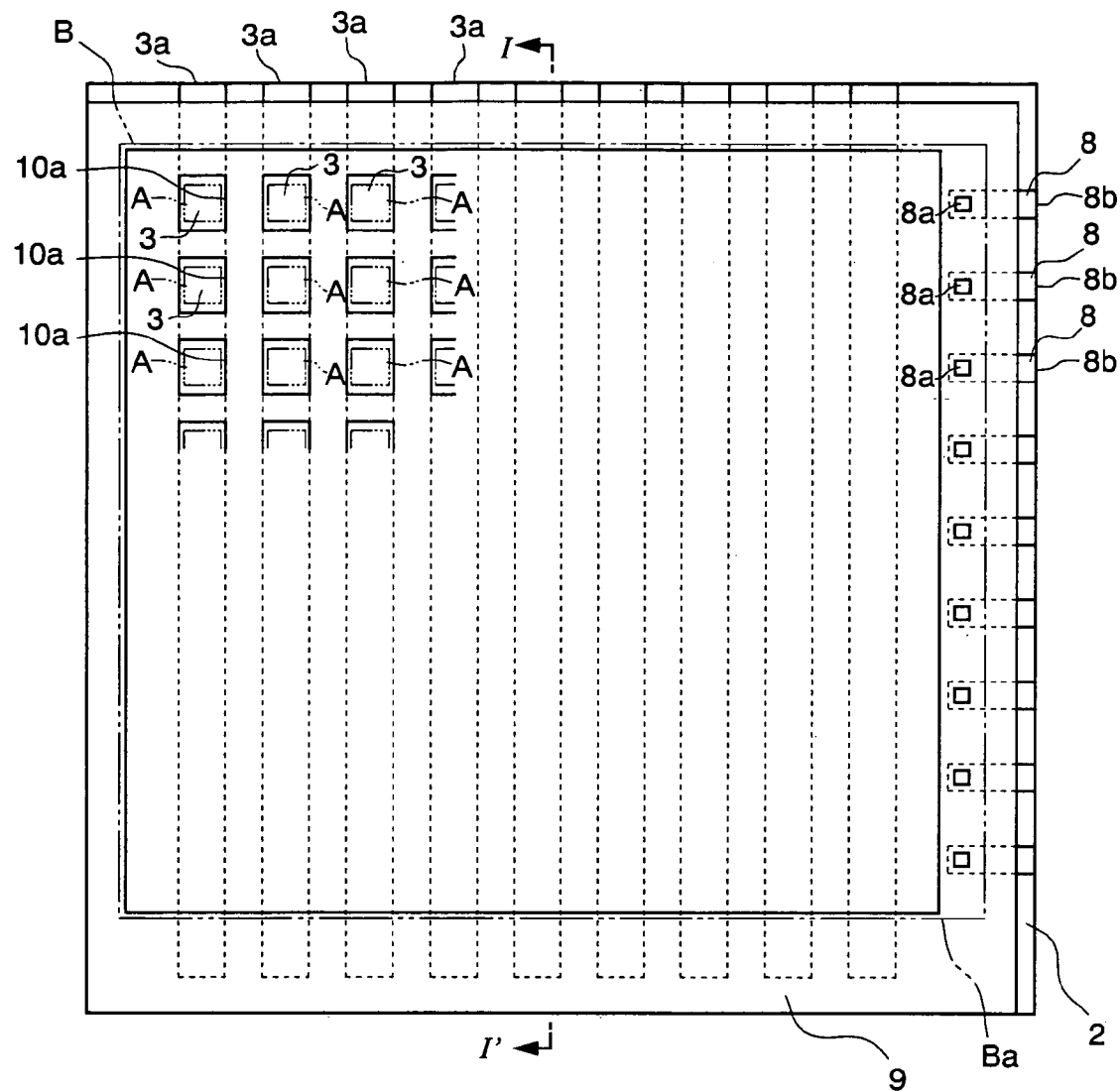
FIGS. 6A and 6B are explanatory drawings for describing a method for manufacturing an organic EL device.
Figure 6B:
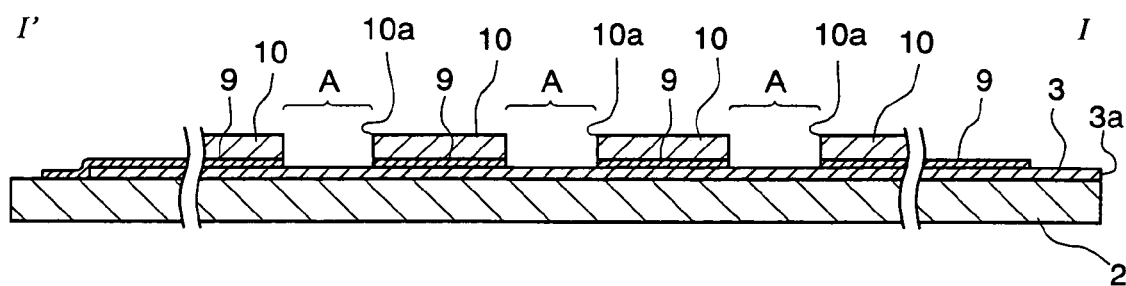

A bank-layer-forming step is a step, as shown in FIGS. 6A and 6B, for forming a bank layer 10 on a cathode-separator-forming area B, so as not to cover a junction 8a and so as to form an opening 10a in a position corresponding to a light-emitting area A. The bank-layer-forming step coats the substrate which has the above-described first electrode 3 and insulation film 9 already formed thereon, with a photosensitive material (an organic material) having heat resistance and solvent resistance, such as an acrylic resin and a polyimide resin into a thickness not thinner than the organic functional layer 6 and not thicker than the cathode separator 4, and forms an opening 10a in the position corresponding to a light-emitting area A with a photolithography technique.

(4) Cathode-Separator-Forming Step

Figure 7A:
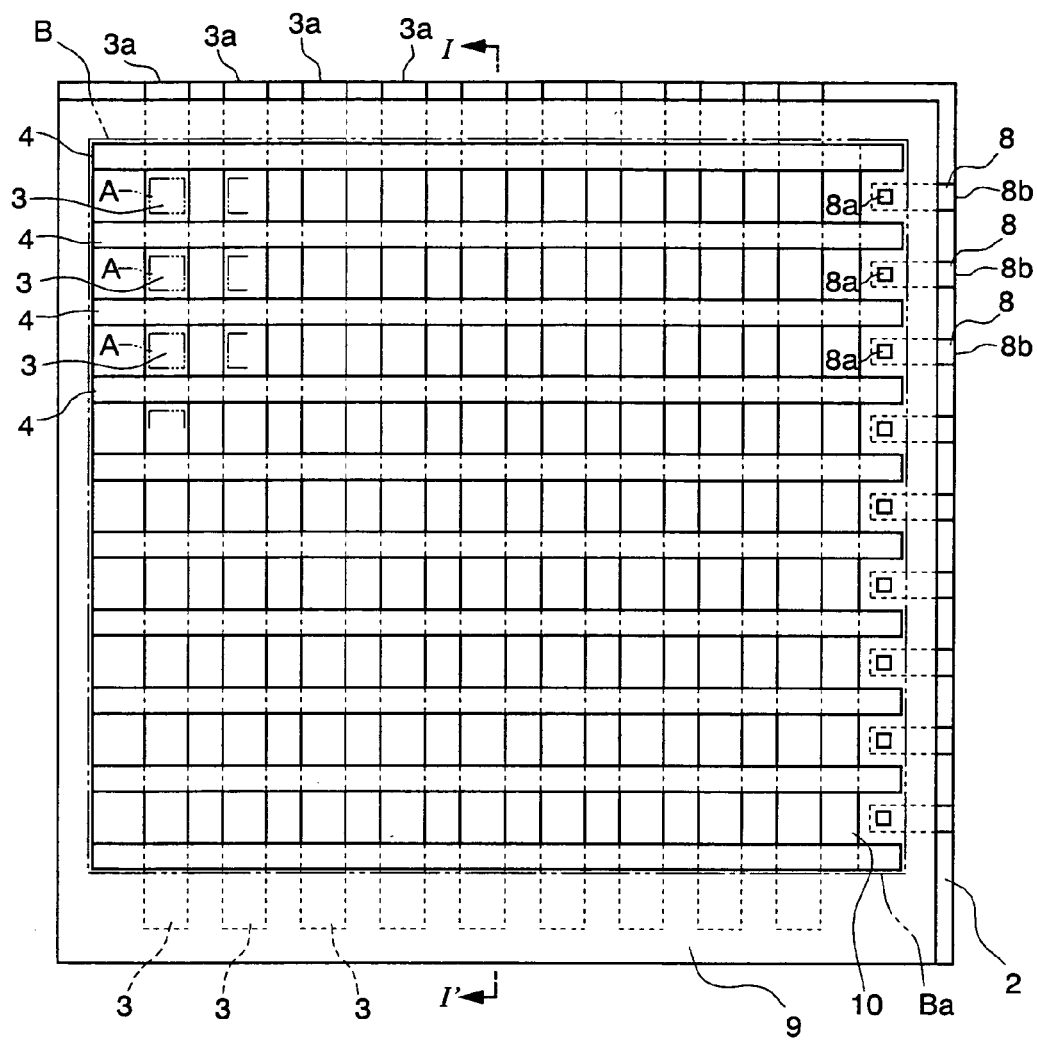
FIGS. 7A and 7B are explanatory drawings for describing a method for manufacturing an organic EL device.
Figure 7B:
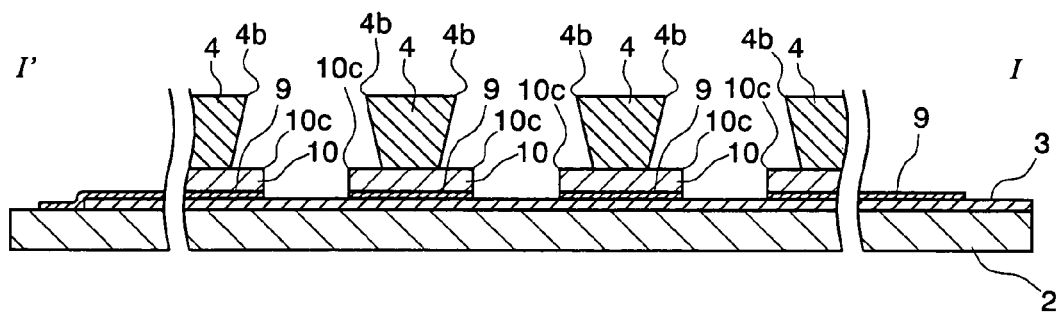

A cathode-separator-forming step is a step, as shown in FIGS. 7A and 7B, for forming a plurality of cathode separators 4 extending to the direction perpendicular to the extending direction of the first electrode 3, in a strip at predetermined spacings. The cathode-separator-forming step, at first, applies the photosensitive resin such as polyimide onto a substrate 2 into a predetermined thickness with a spin coat method or the like; etches the photosensitive resin such as polyimide coated into the predetermined thickness with a photolithographic technique, to form a plurality of cathode separators 4 which have a cross section in a width direction set to a shape of a reverse taper, on a cathode-separator-forming area B. The cathode separators 4 are formed so that the junction 8a is located in a position between the cathode separators, and so that the ends 4b of the width direction of the cathode separators 4 are placed in a position deviated to the outside of a light-emitting area A from the end 10c (an edge) of the bank layer 10.

(5) Plasma Treatment Step

A plasma treatment step is carried out for the purpose of activating the surface of the first electrode 3, and further surface-treating the surfaces of a bank layer 10 and a cathode separator 4. Specifically, the plasma treatment step includes the first step of plasma-treating the surfaces with $O_2$, to clean the exposed first electrode 3 (ITO), further adjust a work function, and make the surfaces of the bank layer 10, the exposed first electrode 3 and the cathode separator 4 make liquid-affinity; and the second step of plasma-treating the surfaces with $CF_4$ to make the surfaces of the bank layer 10 and the cathode separator 4 make liquid-repellent.

(6) Hole Injection/Transportation Layer-Forming Step

Figure 8A:
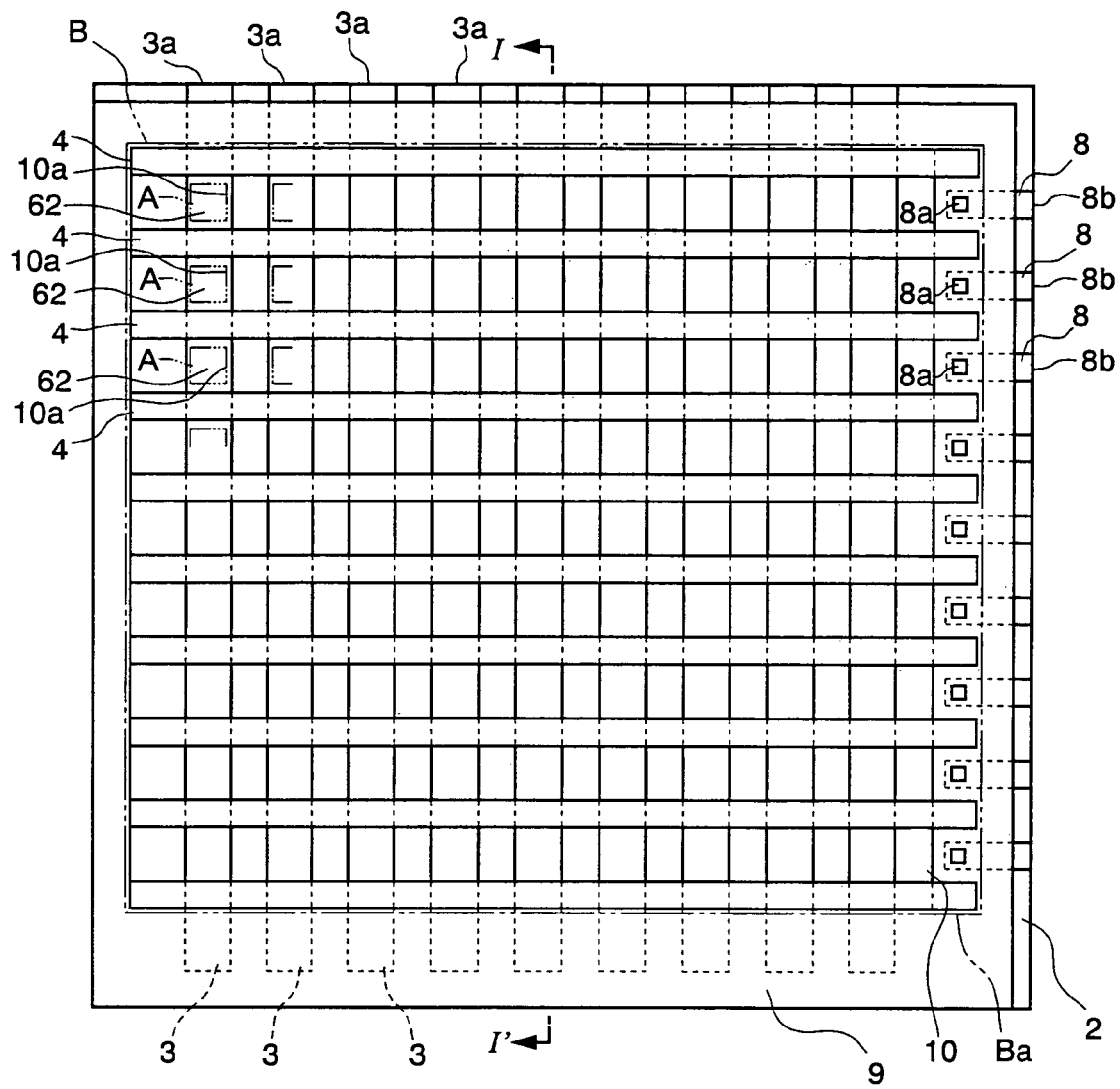
FIGS. 8A and 8B are explanatory drawings for describing a method for manufacturing an organic EL device.
Figure 8B:
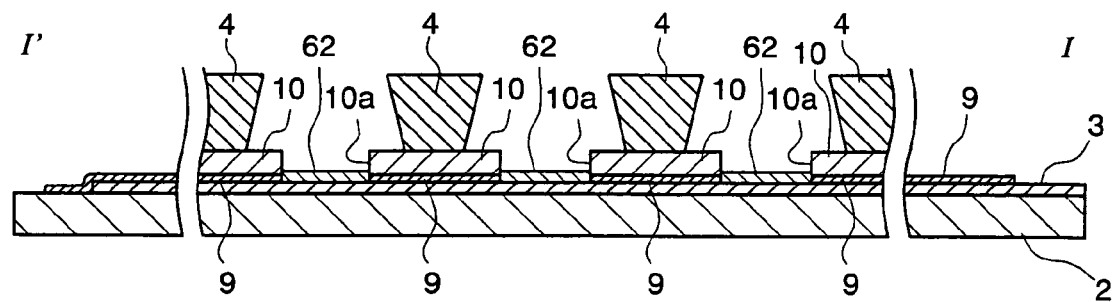

A hole injection/transportation layer-forming step is a step for forming a hole injection/transportation layer 62 on an exposed first electrode 3, or equivalently, in the opening 10a of the bank layer, with a droplet ejecting method. The hole injection/transportation layer-forming step includes ejecting a material for the hole injection/transportation layer on the first electrode 3 with an inkjet device for instance; and then drying and heating the ejected ink to form the layer on the first electrode 3, as shown in FIGS. 8A and 8B.

The inkjet device ejects a material onto the area to be ejected, by ejecting the material of a controlled liquid volume per drop from a ejecting nozzle provided in an inkjet head, facing the ejecting nozzle toward a substrate, and further relatively moving the ejecting nozzle with respect to the substrate 2. In the above step, because the surface of the bank layer 10 is made liquid-repellent through the above-described plasma treatment step, even if the material discharged from the ejecting nozzle covers the top surface of the bank layer, the material reliably enters the inside of the opening 10a of the bank layer 10.

(7) Light-Emitting Layer-Forming Step

Figure 9A:
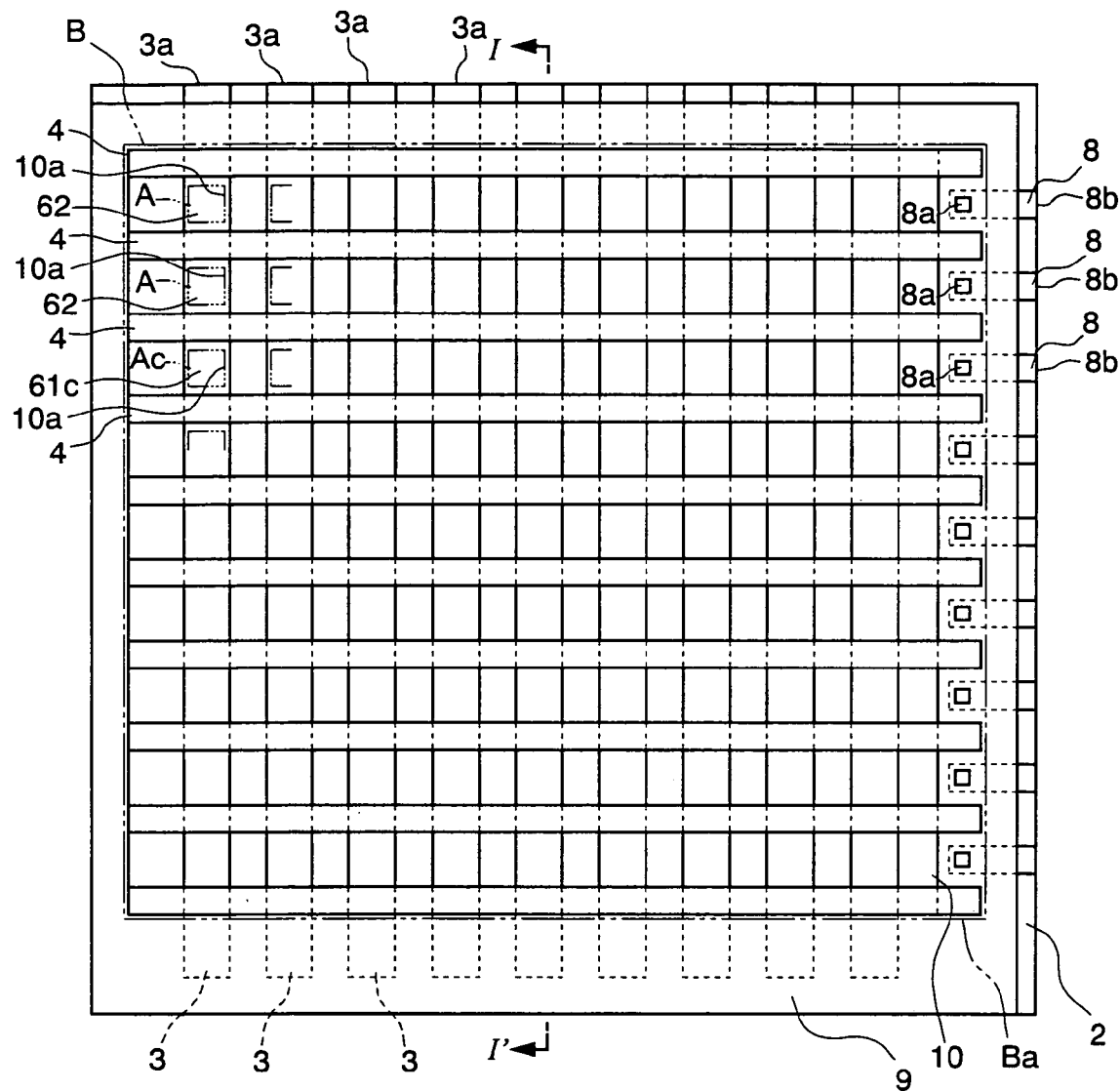
FIGS. 9A and 9B are explanatory drawings for describing a method for manufacturing an organic EL device.
Figure 9B:
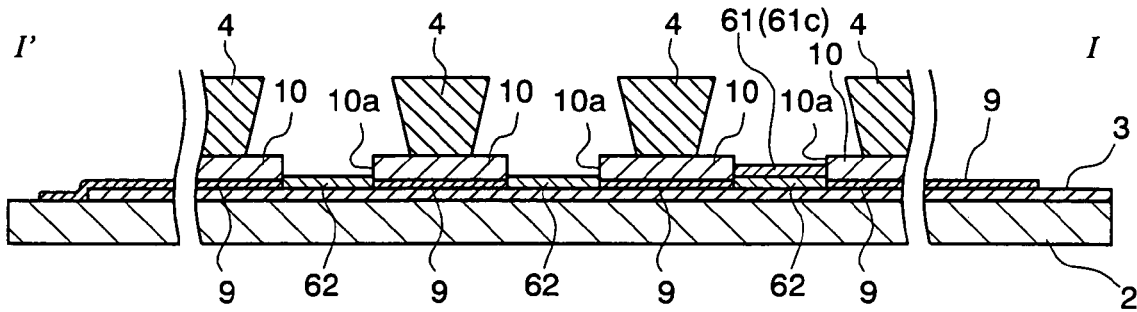
Figure 10A:
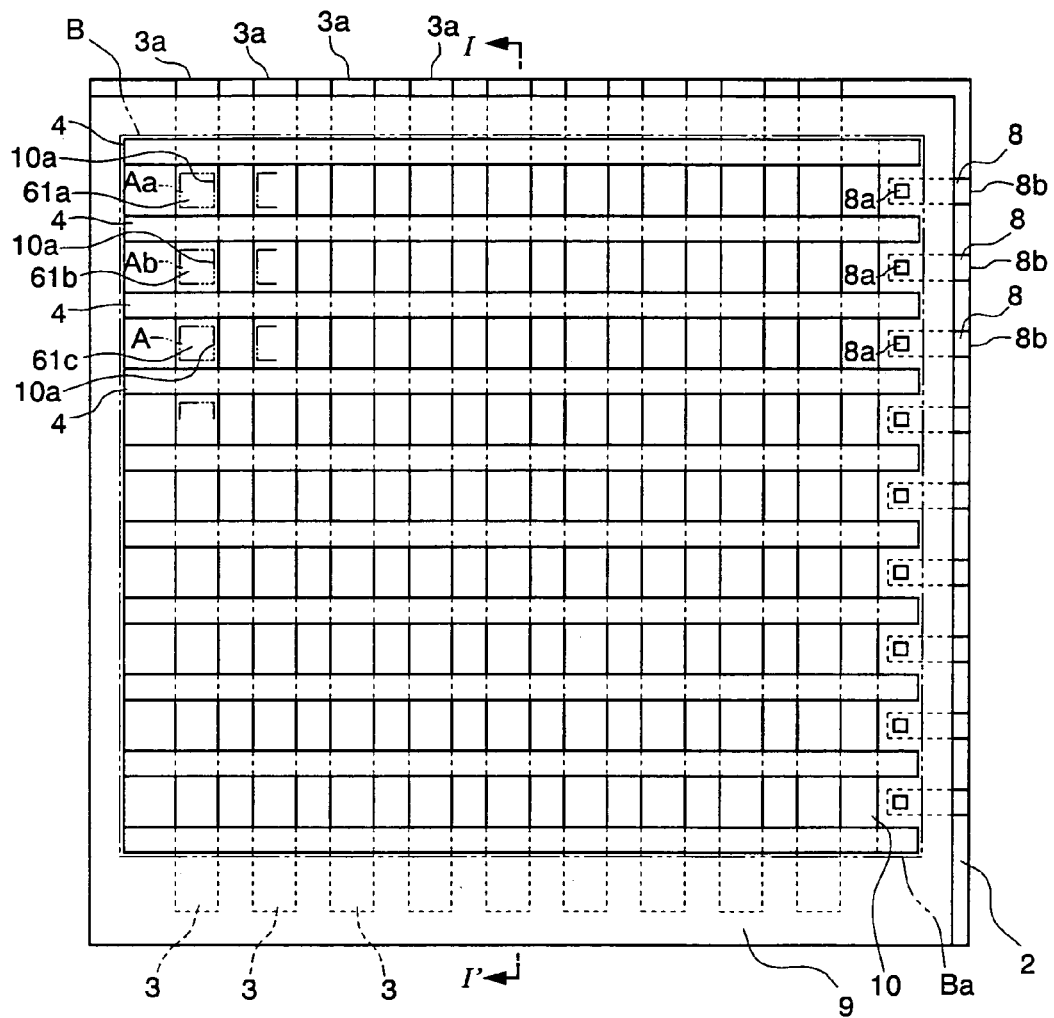
FIGS. 10A and 10B are explanatory drawings for describing a method for manufacturing an organic EL device.
Figure 10B:
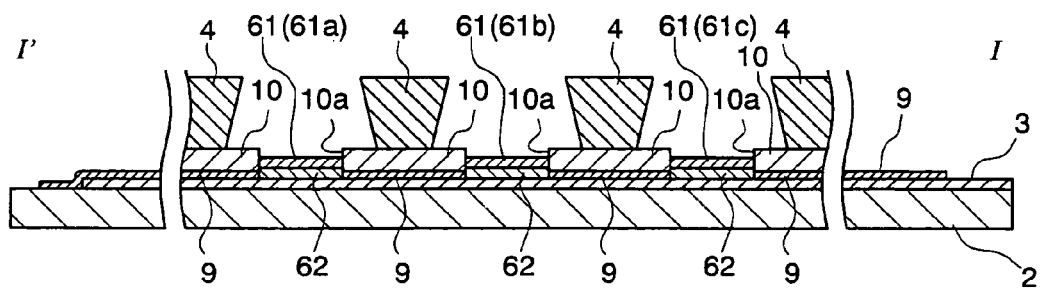

A light-emitting layer-forming step is a step, as shown in FIGS. 9A, 9B, 10A and 10B, for forming the light-emitting layer 61 containing a low molecular material, on a hole injection/transportation layer 62 formed on the first electrode 3. In the light-emitting layer-forming step, a blue-light-emitting layer 61c is formed as shown in FIGS. 9A and 9B, by at first ejecting a blue-light-emitting layer material in an opening 10a of a bank layer 10 corresponding to a blue-light-emitting area Ac, with a droplet ejecting method using an inkjet device for instance; subsequently a red-light-emitting layer 61a is formed by ejecting a red-light-emitting layer material in the opening 10a of the bank layer 10 corresponding to a red-light-emitting area Aa; and a green-light-emitting layer 61b is formed by ejecting a green-light-emitting layer material in the opening 10a of the bank layer 10 corresponding to a green-light-emitting area Ab (see FIGS. 10A and 10B).

(8) Electron Injection/Transportation Layer-Forming Step

Figure 11A:
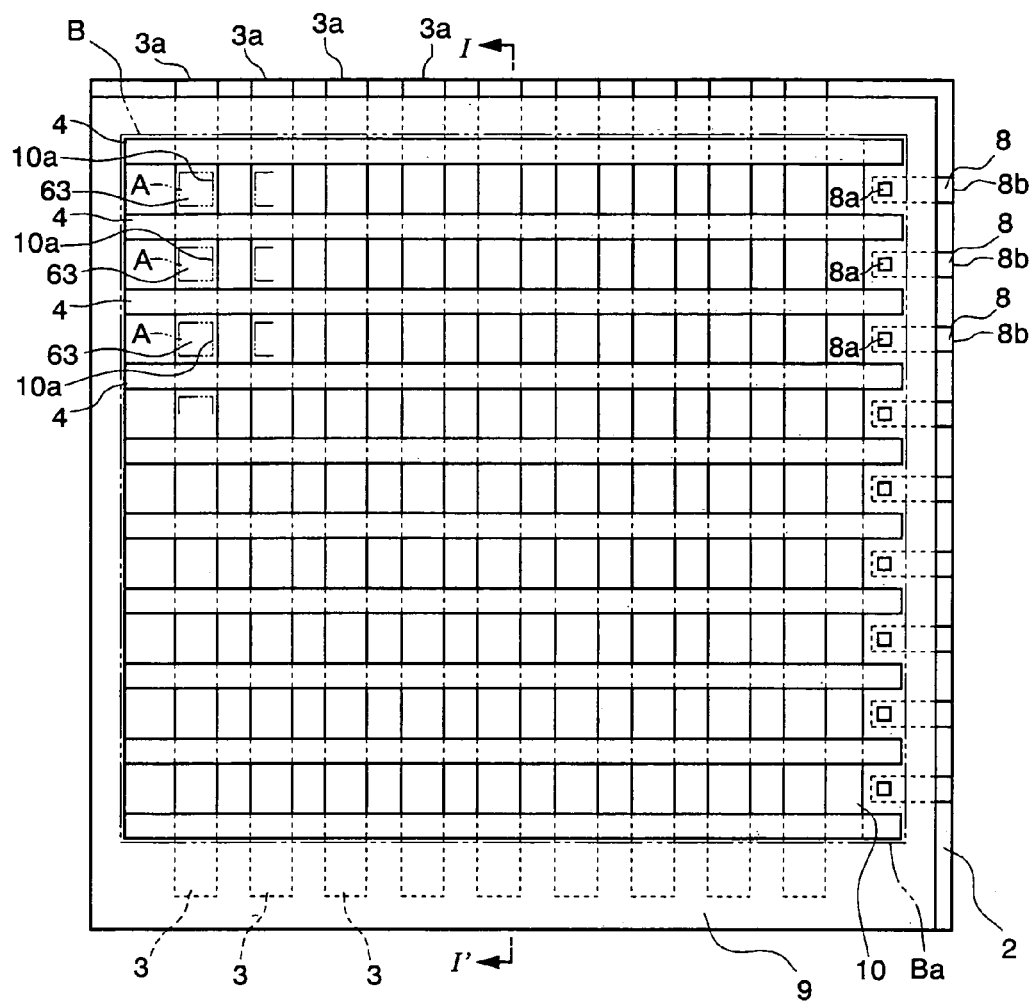
FIGS. 11A and 11B are explanatory drawings for describing a method for manufacturing an organic EL device.
Figure 11B:
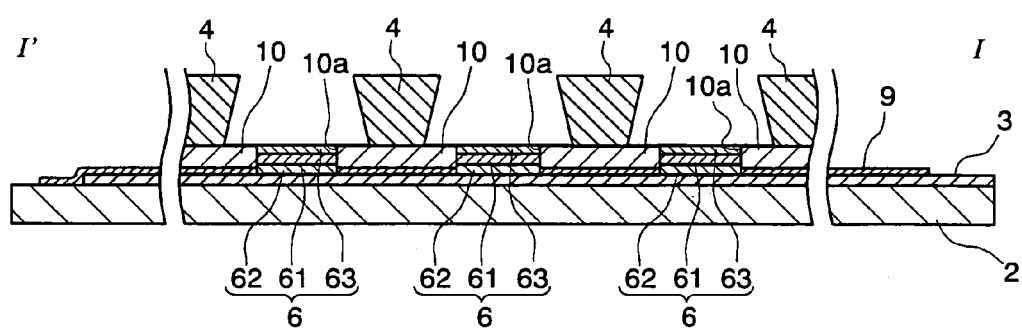
Figure 12A:
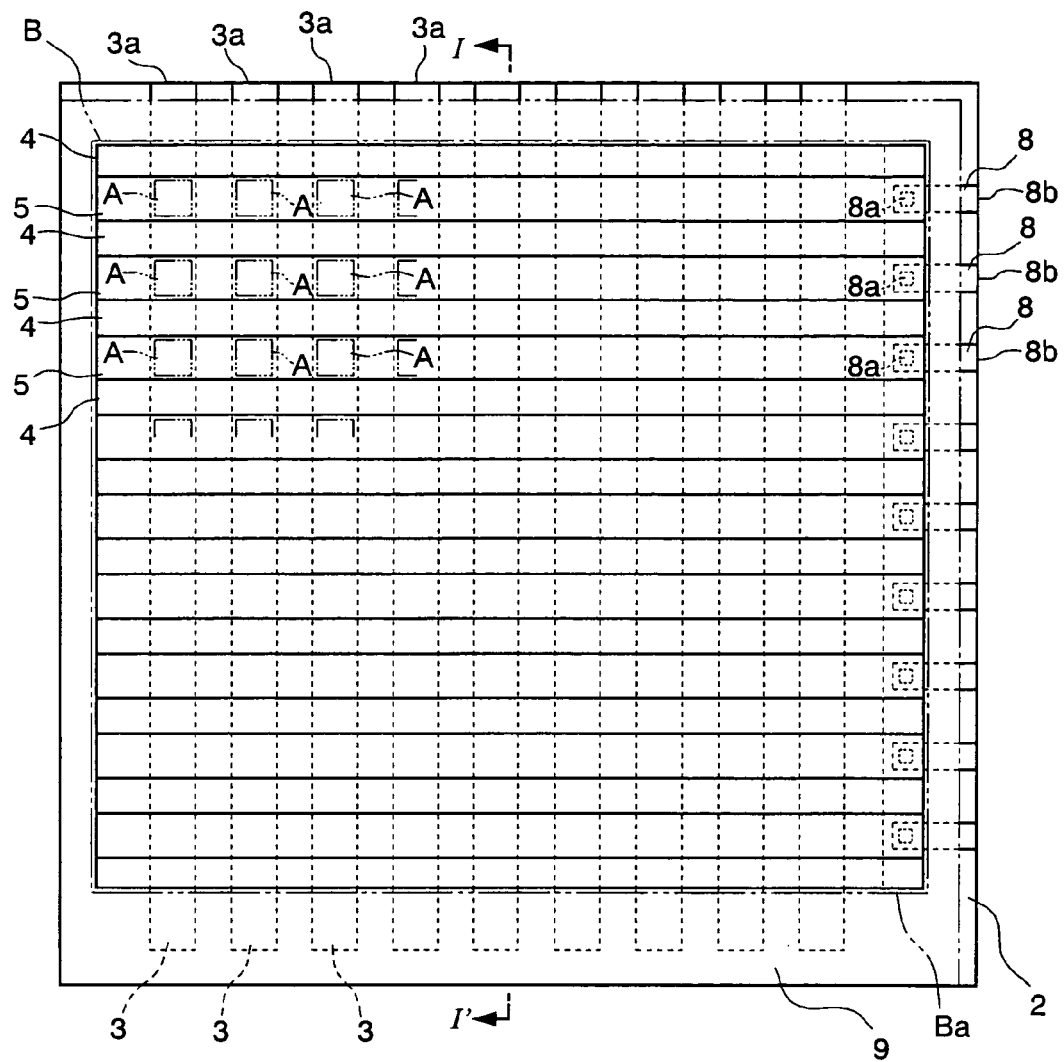
FIGS. 12A and 12B are explanatory drawings for describing a method for manufacturing an organic EL device.
Figure 12B:
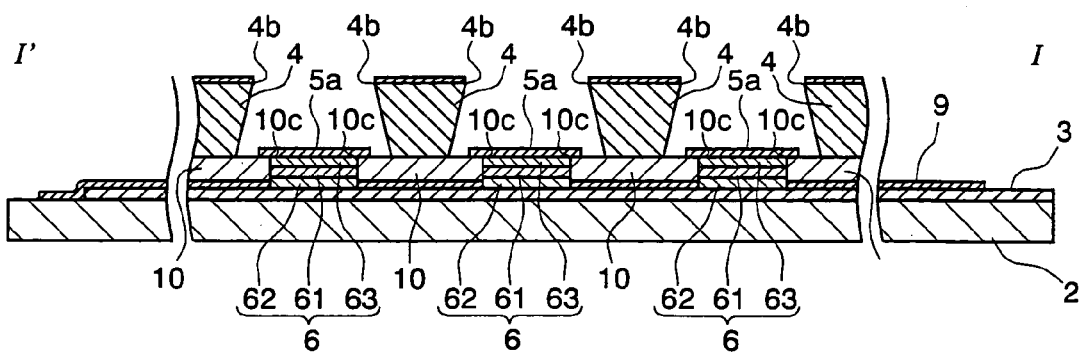

An electron injection/transportation layer-forming step is a step, as shown in FIGS. 11A and B, for forming an electron injection/transportation layer 63 on a light-emitting layer 61. In the electron injection/transportation layer-forming step, the electron injection/transportation layer 63 is formed by discharging a material for an electron injection/transportation layer on the light-emitting layer 61 with a droplet ejecting method using an inkjet device for instance. The total step of a hole injection/transportation layer-forming step, the light-emitting layer-forming step and the electron injection/transportation layer-forming step is called an organic functional-layer-forming step.

As described above, the organic functional layer 6 of the layered body consisting of a hole injection/transportation layer 62, a light-emitting layer 61 and an electron injection/transportation layer 63 is formed by ejecting the material into the opening 10a formed on the bank layer 10 with a droplet ejecting method. As a result, the buildup of the organic functional layer 6 along the side surface of a cathode separator 4 can be prevented.

(9) Second-Electrode-Forming Step

A second-electrode-forming step is a step, as shown in FIGS. 12A, 12B, 13 and 14, for forming a second electrode 5 between the adjacent cathode separators 4, and includes the step for forming the first film 5a with a vapor deposition method and the step for forming the second film 5b on the first film 5a with a droplet ejecting method.

In a step for forming the first film 5a, a material for forming the first film 5a is deposited on the whole area of the cathode-separator-forming area B from the direction perpendicular to a substrate 2, through a vapor deposition mask with a single opening having the same shape as that of the cathode-separator-forming area B. Here, as described above, the end 4b in the width direction on the top of the cathode separator 4 is arranged in a position deviated to the outside of the light-emitting area A from the end of the opening 10a of the bank layer 10. As a result, when the material for forming the first film 5a is evaporated from the direction perpendicular to the surface of the substrate 2, as shown in the drawing, an electrode film can be easily formed so as to cover the opening 10a of the bank layer 10. Thereby, the organic functional layer 6 is accommodated in the space surrounded by the bank layer 10, the first electrode 3 and the second electrode 5 (the first film 5a) thereby. Accordingly, the organic functional layer 6 can be protected from moisture or air invading from the outside, then be prevented from the deterioration, and consequently acquire the adequate life for emitting light. Similarly, because the opening 10a of the bank layer 10 is covered by the first film 5a (an evaporated film), the organic functional layer 6 is avoided from being damaged by a liquid content (a dispersing liquid) contained in a material for forming the second film 5b which will be described in the next place.

In a step for forming the second film 5b, as will be described below, the material for forming the second film 5b is placed on the first film 5a with a droplet ejecting method using an inkjet device, and then the coated film is dried. Then, the second film is baked to secure electroconductivity. In addition, if further film-thickening is needed, after the baking has been finished, the material may be printed, dried and baked again.

Figure 13:
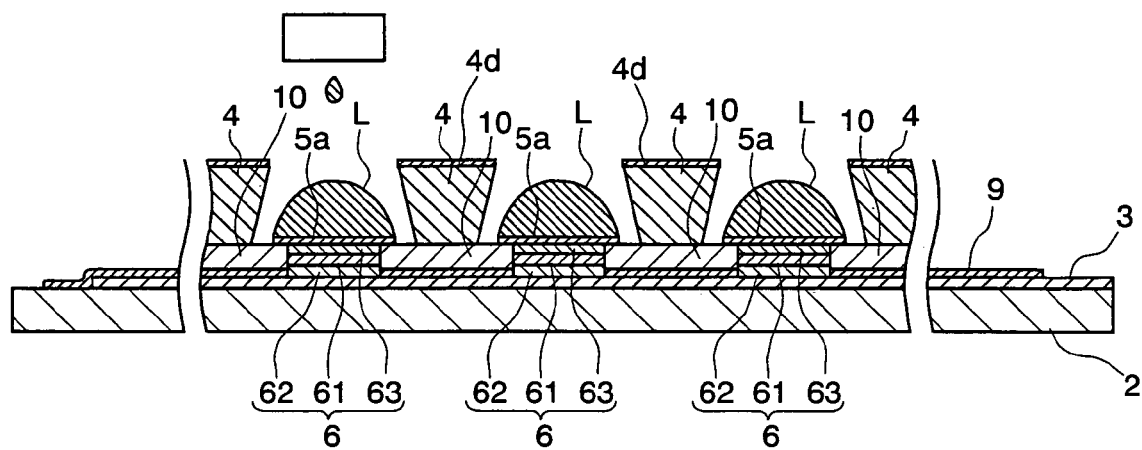
FIG. 13 is an explanatory drawing for describing a method for manufacturing an organic EL device.

An inkjet device, as shown in FIG. 13, ejects the electrode material L of a controlled liquid volume per drop from a ejecting nozzle provided in an inkjet head, faces the ejecting nozzle toward a substrate, and further relatively moves the ejecting nozzle with respect to a substrate 2, to arrange the electrode material on the substrate 2. A wall for trapping the flow of the material to be arranged between the adjacent cathode separators 4, toward left and right directions in FIG. 12A, may be previously provided on the substrate 2.

In the above step, because the surface of a bank layer 10 is made liquid-repellent in the above-described plasma treatment step, a material for forming the second film 5b ejected from the ejecting nozzle hardly flows to the top surface of the bank layer, and consequently is adequately arranged on the first film 5a. Accordingly, the bank layer 10 preferably has the surface of giving the contact angle of, for instance, 60 degrees or higher with respect to the material for forming the second film 5b.

In addition, with respect to a material for forming the second film 5b, the surface of the first film 5a preferably forms a lower contact angle than the surface of a bank layer 10 forms. Thereby, the material for forming the second film 5b wetly spreads over the surface of the first film 5a, and is prevented from flowing to its outer material (the bank layer 10). Specifically, the material is more accurately arranged. In order to achieve the above condition, the first film 5a may be formed of a material having comparatively high surface energy, or may be imparted liquid-affinity on the surface by some treatment.

An applicable droplet ejecting method includes various well-known technologies such as a piezo method of ejecting ink by using a piezoelectric element which is an element made of a piezoelectric material, and a bubble method of ejecting a liquid material along with bubbles formed by the heating of the liquid material. Among the methods, the piezo method does not heat the liquid material, so that the method has an advantage of not affecting the composition of the material and the like. In the present embodiment, the above-described piezo method is employed.

A material used for forming the second electrode 5 is a dispersion liquid of dispersing electroconductive fine particles in a dispersion medium (a metal-dispersed ink, an Ag-dispersed ink in the present embodiment). The metallic fine particle containing one of gold, silver, copper, palladium and nickel, and the fine particle of an electroconductive polymer or a superconductor or the like is used here as the electroconductive fine particle. The electroconductive fine particle to be used here can have the surface coated with an organic substance in order to improve its dispersibility. A material to be coated on the surface of the electroconductive fine particle includes an organic solvent such as xylene and toluene, or citric acid. The dispersion medium for a liquid containing the electrconductive fine particle is not limited in particular so long as to be capable of dispersing the above-described electroconductive fine particles and as not to cause aggregation, but includes alcohols, a hydrocarbon-based compound, an ether-based compound, a polar compound and water. As for these dispersion medium, a vapor pressure at room temperature, viscosity, the concentration of dispersoid and surface tension are controlled. The medium can be used singly or in the mixed state of two or more mediums. In addition, in order to adjust the surface tension of the above-described dispersion medium, it is recommended to add a trace amount of a surface tension modifier containing a fluorine-based compound, a silicone-based compound and a nonionic surface active agent in such a range of unreasonably decreasing a contact angle with a substrate. In addition, the above-described dispersion medium may include organic compounds such as alcohols, ethers, esters and ketones, as needed.

A technique to be used for drying (or baking) the applied film of an electrode material includes an in-furnace baking method of placing a substrate in a heating furnace (a baking furnace), and heating and drying the applied film; a hot-plate method of mounting the substrate on a plate (a hot plate), and heating and drying the applied film through the plate; and a vacuum method of placing the substrate in a sealable chamber to reduce pressure in the chamber, and vacuum drying the applied film.

Figure 14:
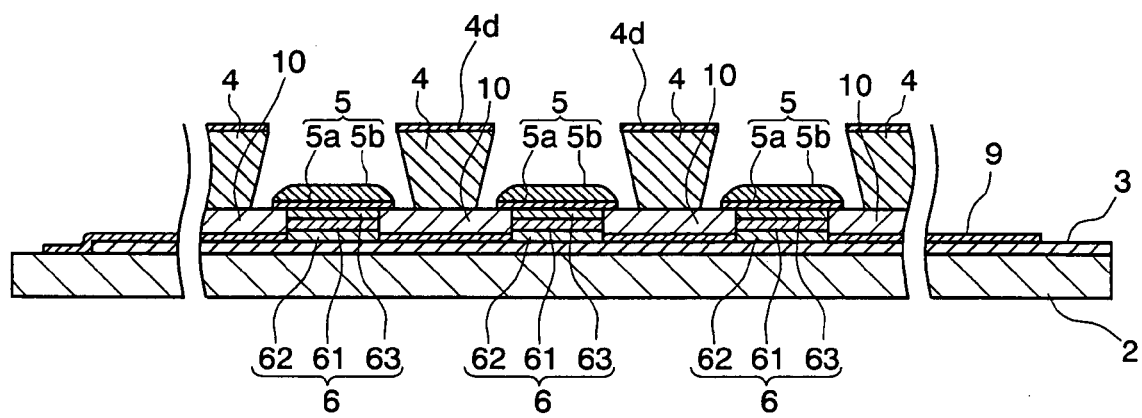
FIG. 14 is an explanatory drawing for describing a method for manufacturing an organic EL device.

By these techniques, the second film 5b is formed, as shown in FIG. 14, on the first film 5a, so as not to contact with both of two adjacent cathode separators 4. The second electrode 5 having the above-described layered structure consisting of the first film 5a and the second film 5b placed thereon acquires a film of which the thickness has been increased. In Particular, the second film 5b of which the material has been placed with a droplet ejecting method can become a reliably thick film.

The second film 5b may be placed by not only the droplet ejecting method but also a screen printing-method and an offset printing method.

When the first film 5a is formed with an vapor deposition method, an electrode film (an evaporated film) is formed also on the top surface 4d of a cathode separator 4, but because the second film 5b for increasing the film thickness is formed so as not to contact with both of two adjacent cathode separators 4, the short circuit between the second electrodes 5 through the cathode separator 4 is prevented.

(10) Sealing Step

Finally, a substrate 2 having the first electrode 3, an organic functional layer 6 and the second electrode 5 formed in the above-described steps, and a sealing can 7b are sealed through a sealing resin 7a. For instance, the sealing resin 7a consisting of a thermosetting resin or an ultraviolet-curing resin is applied on the periphery of the substrate 2, and the sealing can 7b is placed on the sealing resin (see FIG. 3). The sealing step is carried out preferably in an atmosphere of an inert gas such as nitrogen, argon and helium. If the sealing step is carried out in atmospheric air, and the second electrode 5 has flaws like pinholes therein, water or oxygen invades into the second electrode 5 through the flaws and may undesirably oxidize the second electrode 5.

Then, an organic EL device 1 according to the present embodiment is completed by connecting a data side drive circuit 100 installed on a substrate 2 or outside the substrate 2 to the first electrode 3, and a scanning side drive circuit 101 installed on or outside the substrate 2 to the second electrode 5.

In the organic EL device 1, the second electrode 5 has a layered structure consisting of the first film 5a and the second film 5b to increase the film thickness of the electrode. The thickened film of the second electrode 5 inhibits a voltage drop in the second electrode 5, and consequently makes picture quality uniform. In addition, because the second film 5b for increasing the film thickness is formed so as not to contact with both of two adjacent cathode separators 4, the short circuit between the second electrodes 5 through the cathode separator 4 is prevented to improve the reliability.

In the above-described embodiment, the low molecular material was used for a light-emitting layer 61, but a polymer material may be used. The polymer material to be used for the light-emitting layer includes a (poly)para-phenylenevinylene derivative, a polyphenylene derivative, a poly-fluorene derivative, polyvinyl carbazole, a polythiophene derivative, a perylene-based pigment, a cumarin-based pigment, a rhodamine-based pigment; or the polymeric material doped with rubrene, perylene, 9,10-diphenylanthracene, tetraphenylbutadiene, Nile red, cumarin 6 and quinacridon.

Second Embodiment

In the following, the second embodiment of an organic EL device according to the present invention will be described with reference to FIG. 15.

Figure 15:
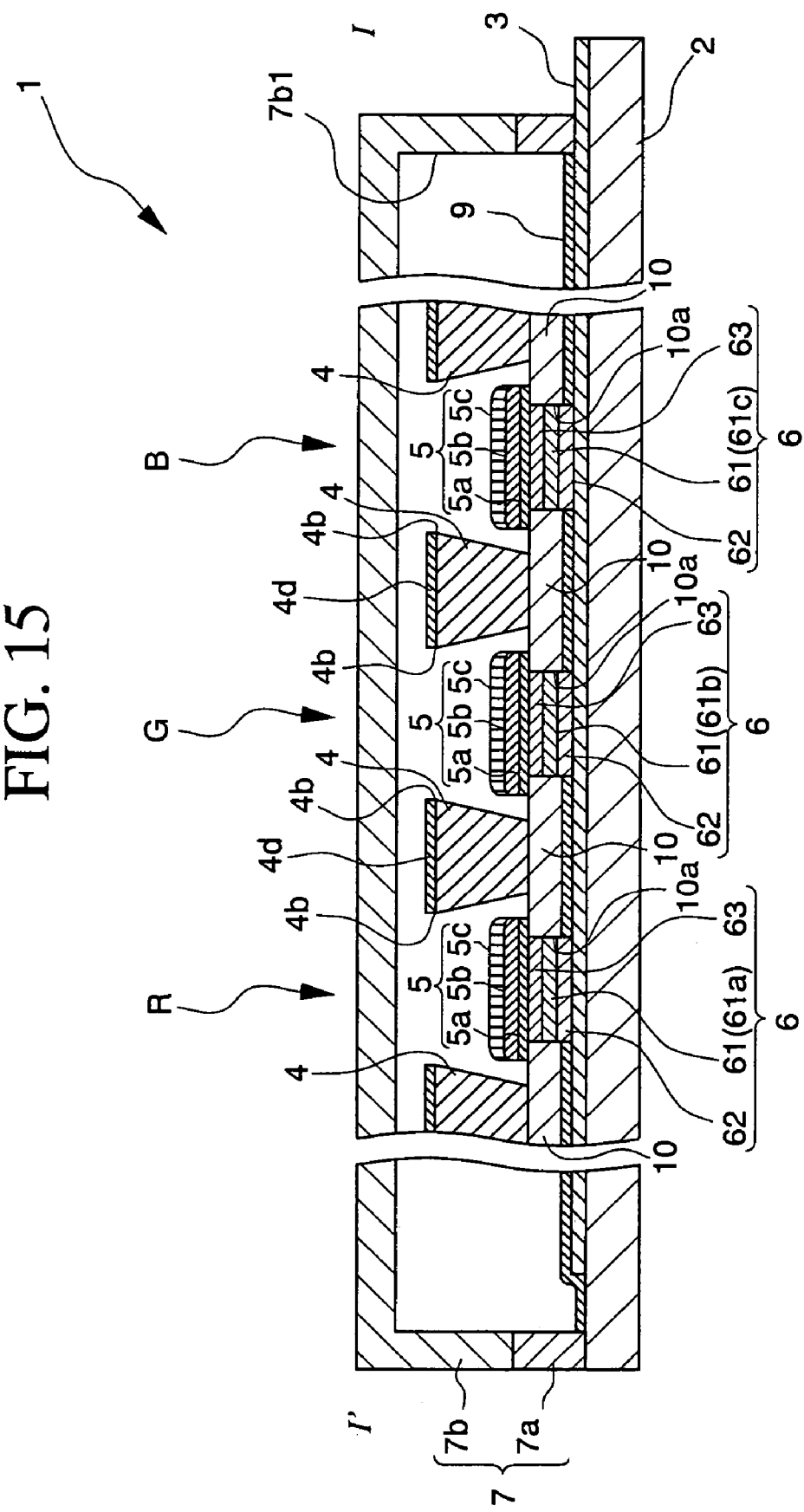
FIG. 15 is an explanatory drawing for describing the second embodiment according to the present invention.

In the present embodiment, as shown in FIG. 15, the second electrode 5 has the layered structure consisting of the first film 5a, the second film 5b and the third film 5c. A step for manufacturing the organic EL device 1 includes, in the step for forming the second electrode 5, repeating (twice in the present embodiment) the steps of placing an electrode material with a droplet ejecting method, on the electrode film (the first film 5a) formed by a vapor deposition method, and the step of drying the placed electrode material. Specifically, the step includes forming the second film 5b with the droplet ejecting method on the first film 5a formed by the vapor deposition method, and further forming the third film 5c on the second film 5b with the droplet ejecting method. In thus composed organic EL device 1, the second electrode 5 has a further increased thickness than that in the 1 st embodiment, so that a voltage drop in the second electrode 5 is more reliably inhibited.

Third Embodiment

In the following, the third embodiment of an organic EL device according to the present invention will be described with reference to FIGS. 16 to 18.

Figure 16:
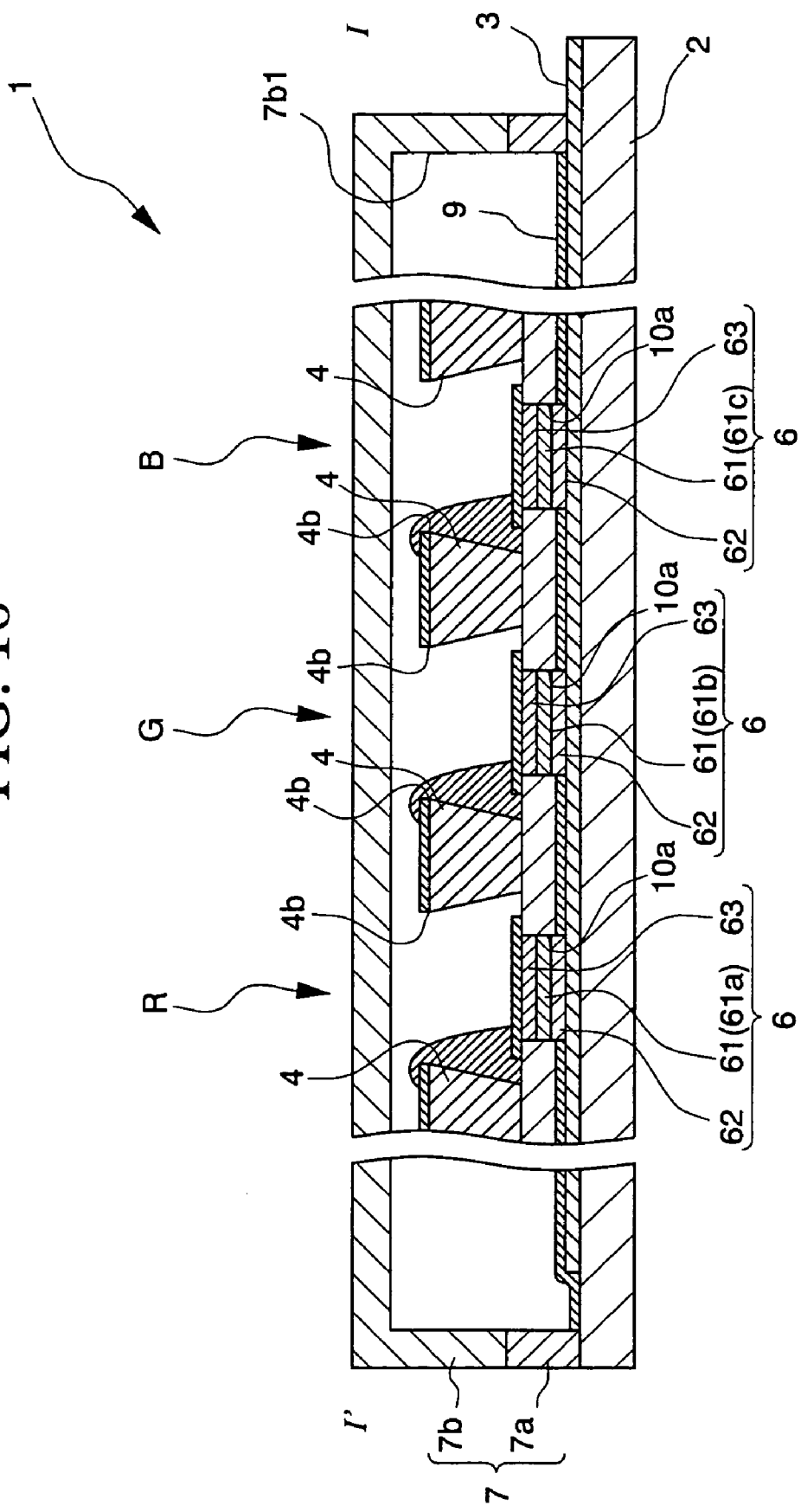
FIG. 16 is an explanatory drawing for describing the third embodiment according to the present invention.

In the present embodiment, as shown in FIG. 16, the second electrode 5 has a layered structure composed of the first film 5a and the second film 5b. The first film 5a is formed by a vapor deposition method, and the second film 5b is formed by a droplet ejecting method. In addition, the second film 5b is formed so as to contact with one of two adjacent cathode separators 4 among a plurality of cathode separators 4, and not to contact with the other. Thereby, in the present embodiment as well, even though an electrode film (an evaporated film) is formed on the top surface 4d of the cathode separator 4, the short circuit between the second electrodes 5 through the cathode separator 4 is prevented.

Figure 17:
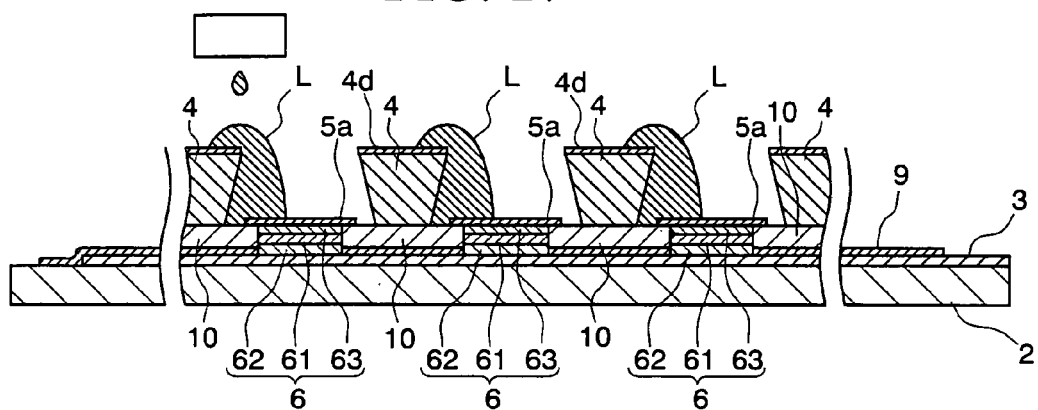
FIG. 17 is an explanatory drawing for describing a method for manufacturing an organic EL device in FIG. 16.
Figure 18:
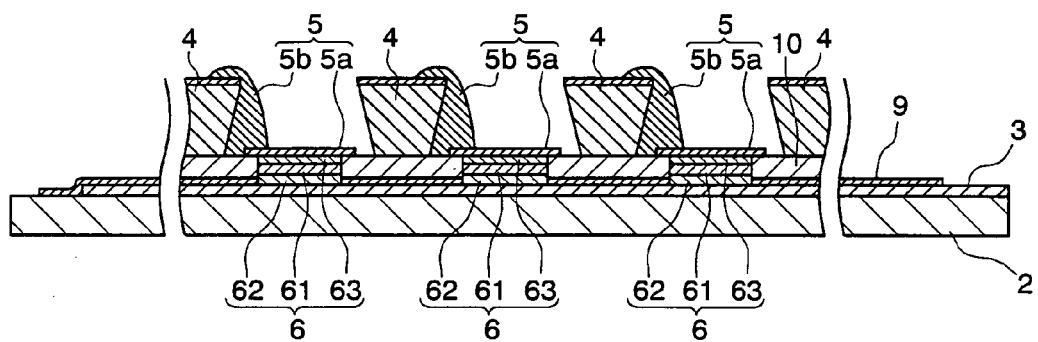
FIG. 18 is an explanatory drawing for describing a method for manufacturing an organic EL device in FIG. 16.

A step for manufacturing the organic EL device 1 includes, in the step for forming the second electrode 5, as shown in FIGS. 17 and 18, placing a material L for forming the second film 5b for increasing the film thickness on the first film 5a of an evaporated film, so as to contact with one of the two adjacent cathode separators 4 and not to contact with the other; and then drying the forming material to form the second film 5b. The above case allows the accuracy of placing the material lower than the previous case of placing the material so as not to contact with both of the cathode separators 4 does as shown in FIG. 13, and is preferably applied to a substrate having the narrow gap between the two adjacent cathode separators 4.

In the present embodiment, a material used for forming the first film 5a which is an evaporated film, has preferably relatively low surface energy like Al and Au, then imparts liquid-repellent to the surface of the first film 5a, and improves the placement accuracy of the material on the first film 5a. In the embodiment, the liquid-repellent of the surface of the first film 5a may be further increased by plasma treatment or the like. The surface of the first film 5a has preferably a contact angle of, for instance, 60 degrees or higher with respect to the material for forming the second film 5b.

Fourth Embodiment

In the next place, the fourth embodiment of an organic EL device according to the present invention will be described with reference to FIG. 19.

Figure 19:
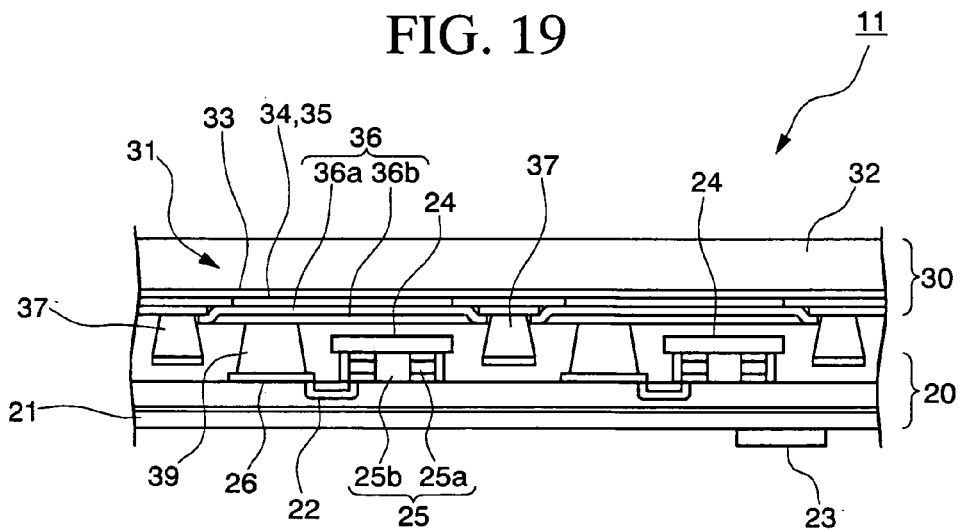
FIG. 19 is an explanatory drawing for describing the forth embodiment according to the present invention.

As shown in FIG. 19, an organic EL device 11 according to the present embodiment has a configuration of connecting a wiring board 20 and an organic EL substrate (a light-emitting device substrate) 30 with a transfer technique called SUFTLA (Surface Free Technology by Laser Ablation) (a registered trademark). The above-described transfer technique is described, for instance, in Japanese Unexamined Patent Application, First Publication Nos. H10-125929, H10-125930, H10-125931 and the like.

A wiring board 20 includes a multilayer substrate 21, a wiring pattern 22 with a predetermined shape formed on the multilayer substrate 21, a circuit (IC) 23 connected to the wiring pattern 22, a TFT (a switching element) 24 for driving an organic EL element 31, a TFT junction 25 for connecting the TFT 24 to the wiring pattern 22, and an organic EL junction 26 for connecting the organic EL element 31 to the wiring pattern 22.

Here, a TFT junction 25 is formed according to the terminal pattern of a TFT 24, and includes, for instance, a bump (an electroconductive protruding portion) 25a formed by electroless plating and a connecting material 25b placed on the bump 25a.

An organic EL substrate 30 comprises a transparent substrate 32 of allowing an emitted light to pass therethrough, the first electrode (an anode) 33 made of a transparent metal such as ITO, an organic functional layer (a hole injection/transportation layer 34 and a light-emitting layer 35), the second electrode (a cathode) 36, and a cathode separator 37. The electron injection/transportation layer may be formed between the light-emitting layer 35 and the second electrode 36.

In addition, between a wiring board 20 and an organic EL substrate 30, a sealing paste 38 is filled and an electroconductive paste 39 for electrically connecting an organic EL junction 26 with a cathode 36 is arranged.

In the present embodiment, the second electrode 36 includes the first film 36a formed with an evaporation method and the second film 36b formed on the first film 36. The second film 36b is formed with a droplet ejecting method so as not to contact with both of adjacent cathode separators 37. As a result, the second electrode 36 has a thickened film, and a short circuit between the second electrodes 36 is avoided. The organic EL device 11 also has a voltage drop in the second electrode 36 inhibited by the thickened film of the second electrode 36, and uniform picture quality.

Fifth Embodiment

Figure 20:
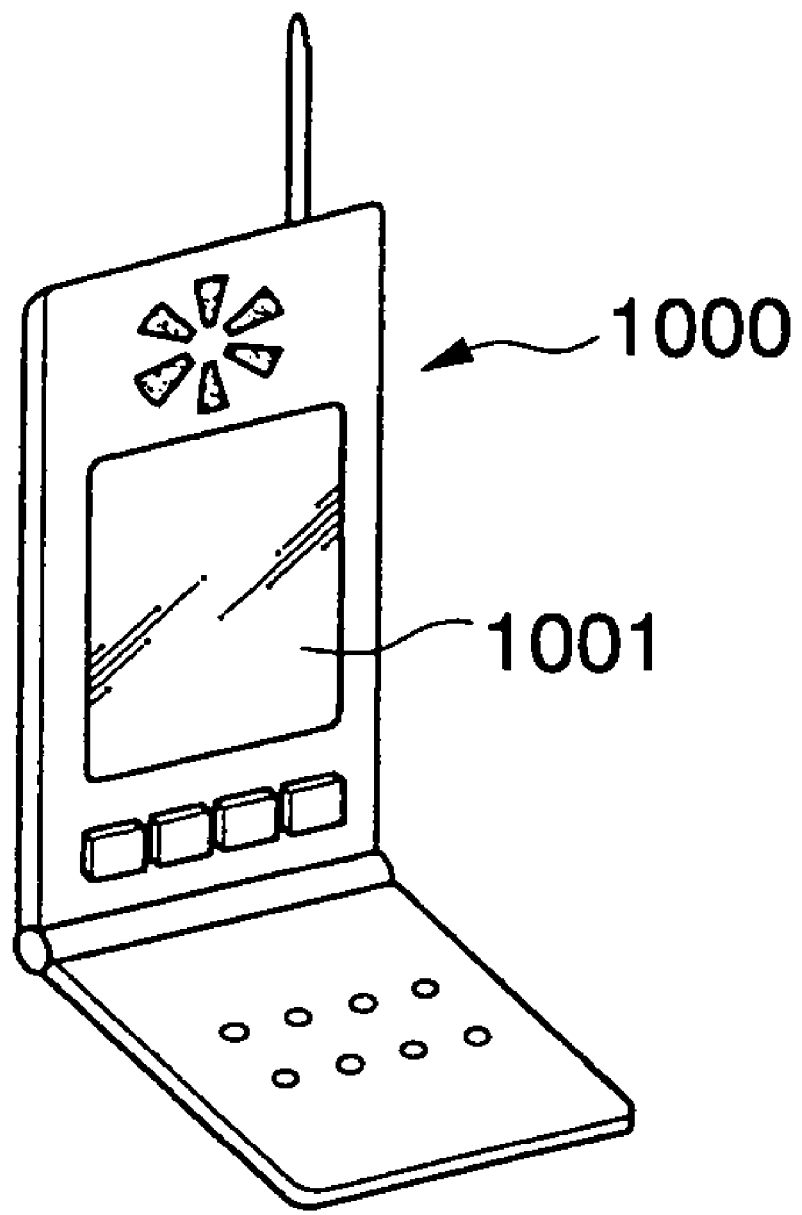
FIG. 20 is a perspective view showing an embodiment of an electronic apparatus according to the present invention.

FIG. 20 shows one embodiment of an electronic apparatus according to the present invention. An electronic apparatus according to the present embodiment mounts an organic EL device 1 shown in FIGS. 1 to 3 thereon as displaying device. FIG. 20 is a perspective view showing one example of a portable telephone. Reference numeral 1000 denotes a main body of a portable telephone, and a reference numeral 1001 denotes a display using the above-described organic EL device 1. As described above, an electronic apparatus according to the present invention has a reduced voltage drop in an electrode, to provide an electronic apparatus with a display having a uniform picture quality.

In the above, the preferred embodiments according to the present invention were described with reference to the attached drawings, but it goes without saying that the present invention is not limited to the embodiments. It is evident that those skilled in the art can conceive various changed or modified examples in a category of a technical idea described in claims, and it is understood that the examples also belong to the technical scope according to the present invention as a matter of course.

What is claimed is:

1. A method for manufacturing an organic electroluminescent device having an organic functional layer formed between first and second electrodes, the method comprising:
   forming the organic functional layer above the first electrode:
   forming separators that separate the second electrode into a strip; and
   forming the second electrode above the organic functional layer, wherein the formation of the second electrode comprises:
     forming an electrode film between the separators with a vapor deposition method, the electrode film covering the entire organic functional layer; and placing an electrode material with a droplet ejecting method on the electrode film.

2. A method for manufacturing an organic electroluminescent device according to claim 1, wherein the electrode material is a metal-dispersed ink.

3. A method for manufacturing an organic electroluminescent device according to claim 1, wherein the electrode material is placed so as not to contact with both of two adjacent cathode separators among the separators.

4. A method for manufacturing an organic electroluminescent device according to claim 1, wherein the electrode material is placed so as to contact with one of two adjacent cathode separators among the separators, and not to contact with the other.

5. A method for manufacturing an organic electroluminescent device according to claim 1, wherein the electrode film prevents the electrode material, which is ejected by droplet ejecting method, form being in contact with the organic functional layer.

6. A method for manufacturing an organic electroluminescent device according to claim 1, wherein the electrode film formed with the vapor deposition method has a contact angle of 60 degrees or higher with respect to the electrode material.

* * * * *